United States Patent
Kim et al.

(10) Patent No.: US 9,293,415 B2
(45) Date of Patent: Mar. 22, 2016

(54) SEMICONDUCTOR DEVICES INCLUDING PROTECTION PATTERNS AND METHODS OF FORMING THE SAME

(71) Applicant: Samsung Electronics Co., Ltd., Suwon-si, Gyeonggi-do (KR)

(72) Inventors: Eun-Ji Kim, Seoul (KR); Sung-Dong Cho, Hwaseong-si (KR); Hyoung-Yol Mun, Yongin-si (KR); Yeong-Lyeol Park, Yongin-si (KR); Seung-Taek Lee, Bucheon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/708,800

(22) Filed: May 11, 2015

(65) Prior Publication Data

US 2015/0340314 A1    Nov. 26, 2015

(30) Foreign Application Priority Data

May 20, 2014    (KR) .................. 10-2014-0060402

(51) Int. Cl.
*H01L 23/52* (2006.01)
*H01L 23/528* (2006.01)
*H01L 23/48* (2006.01)
*H01L 23/532* (2006.01)

(52) U.S. Cl.
CPC ............ *H01L 23/528* (2013.01); *H01L 23/481* (2013.01); *H01L 23/53228* (2013.01); *H01L 23/53257* (2013.01)

(58) Field of Classification Search
CPC ............... H01L 23/528; H01L 23/481; H01L 23/53228
USPC ........................................................ 257/773
See application file for complete search history.

(56) References Cited

U.S. PATENT DOCUMENTS

| 8,618,640 | B2  |    | 12/2013 | Lu et al.     |              |
|-----------|-----|----|---------|---------------|--------------|
| 8,962,474 | B2  | *  | 2/2015  | Yu .............. | H01L 21/76898 |
|           |     |    |         |               | 257/774      |
| 2011/0241185 | A1 |  | 10/2011 | Koester et al. |              |
| 2012/0292746 | A1 | * | 11/2012 | Lee ............. | H01L 21/76898 |
|           |     |    |         |               | 257/621      |
| 2013/0020719 | A1 | * | 1/2013  | Jung ........... | H01L 21/76898 |
|           |     |    |         |               | 257/774      |
| 2013/0140680 | A1 |  | 6/2013  | Harada et al. |              |

FOREIGN PATENT DOCUMENTS

JP    2005-203496    7/2005

* cited by examiner

*Primary Examiner* — Luan C Thai
(74) *Attorney, Agent, or Firm* — Myers Bigel & Sibley, P.A.

(57) ABSTRACT

Semiconductor devices including a protection pattern for reducing galvanic corrosion and methods of forming the semiconductor devices are provided. The semiconductor devices may include a substrate including a keep out zone (KOZ) and a plurality of interconnections, which may be disposed outside of the KOZ on the substrate. The semiconductor devices may also include a through silicon via (TSV) in the KOZ. The TSV may pass through the substrate. The semiconductor device may further include a protection pattern, which may be electrically insulated from the TSV, may be disposed in the KOZ and may include a different conductive material from the TSV. A lower end of the protection pattern may be disposed at a level higher than a lower end of the TSV.

20 Claims, 20 Drawing Sheets

FIG. 36

The Galvanic Table from MIL-STD-889

| Active (Anodic) | |
|---|---|
| 1. Magnesium | 49. Yellow Brass |
| 2. Mg alloy AZ-31B | 50. Muntz Metal 280 |
| 3. Mg alloy HK-31A | 51. Brass (plated) |
| 4. Zinc (hot-dip, die cast, or plated) | 52. Nickel-silver (18% Ni) |
| 5. Beryllium (hot pressed) | 53. Stainless steel 316L (active) |
| 6. Al 7072 clad on 7075 | 54. Bronze 220 |
| 7. Al 2014-T3 | 55. Copper 110 |
| 8. Al 1160-H14 | 56. Red Brass |
| 9. Al 7079-T6 | 57. Stainless steel 347 (active) |
| 10. Cadmium (plated) | 58. Molybdenum, Commercial pure |
| 11. Uranium | 59. Copper-nickel 715 |
| 12. Al 218 (die cast) | 60. Admiralty brass |
| 13. Al 5052-0 | 61. Stainless steel 202 (active) |
| 14. Al 5052-H12 | 62. Bronze, Phosphor 534 (B-1) |
| 15. Al 5456-0, H353 | 63. Monel 400 |
| 16. Al 5052-H32 | 64. Stainless steel 201 (active) |
| 17. Al 1100-0 | 65. Carpenter 20 (active) |
| 18. Al 3003-H25 | 66. Stainless steel 321 (active) |
| 19. Al 6061-T6 | 67. Stainless steel 316 (active) |
| 20. Al A360 (die cast) | 68. Stainless steel 309 (active) |
| 21. Al 7075-T6 | 69. Stainless steel 17-7PH (passive) |
| 22. Al 6061-0 | 70. Silicone Bronze 655 |
| 23. Indium | 71. Stainless steel 304 (passive) |
| 24. Al 2014-0 | 72. Stainless steel 301 (passive) |
| 25. Al 2024-T4 | 73. Stainless steel 321 (passive) |
| 26. Al 5052-H16 | 74. Stainless steel 201 (passive) |
| 27. Tin (plated) | 75. Stainless steel 286 (passive) |
| 28. Stainless steel 430 (active) | 76. Stainless steel 316L (passive) |
| 29. Lead | 77. AM355 (active) |
| 30. Steel 1010 | 78. Stainless steel 202 (passive) |
| 31. Iron (cast) | 79. Carpenter 20 (passive) |
| 32. Stainless steel 410 (active) | 80. AM355 (passive) |
| 33. Copper (plated, cast, or wrought) | 81. A286 (passive) |
| 34. Nickel (plated) | 82. Titanium 5Al, 2.5 Sn |
| 35. Chromium (Plated) | 83. Titanium 13V, 11Cr, 3Al (annealed) |
| 36. Tantalum | 84. Titanium 6Al, 4V (solution treated and aged) |
| 37. AM350 (active) | 85. Titanium 6Al, 4V (anneal) |
| 38. Stainless steel 310 (active) | 86. Titanium 8Mn |
| 39. Stainless steel 301 (active) | 87. Titanium 13V, 11 Cr 3Al (solution heat treated and aged) |
| 40. Stainless steel 304 (active) | 88. Titanium 75A |
| 41. Stainless steel 430 (active) | 89. AM350 (passive) |
| 42. Stainless steel 410 (active) | 90. Silver |
| 43. Stainless steel 17-7PH (active) | 91. Gold |
| 44. Tungsten | 92. Graphite |
| 45. Niobium (columbium) 1% Zr | |
| 46. Brass, Yellow, 268 | End - Noble (Less Active, Cathodic) |
| 47. Uranium 8% Mo. | |
| 48. Brass, Naval, 464 | |

SEMICONDUCTOR DEVICES INCLUDING PROTECTION PATTERNS AND METHODS OF FORMING THE SAME

CROSS-REFERENCE TO RELATED APPLICATION

This U.S. non-provisional application claims priority under 35 U.S.C. §119 to Korean Patent Application No. 10-2014-0060402, filed on May 20, 2014, the disclosure of which is hereby incorporated by reference in its entirety.

BACKGROUND

The present disclosure generally relates to the field of electronics and, more particularly, to semiconductor devices.

Various techniques for implementing through silicon vias (TSV) of semiconductor devices have been studied. While performing a process of removing a CMP stop layer, upper ends of the TSV and a contact plug may be exposed to a cleaning solution or an etching gas and galvanic corrosion may occur on the upper ends of the TSV and the contact plug. Further, a by-product of the galvanic corrosion may adhere to the upper ends of the TSV and the contact plug. Galvanic corrosion and by-product of galvanic corrosion may degrade the characteristics of the semiconductor devices.

SUMMARY

Embodiments of the present inventive concept provide a semiconductor device capable of reducing or possibly preventing characteristic degradation around a through silicon via (TSV).

Some embodiments of the present inventive concept provide a method of forming a semiconductor device capable of reducing or possibly preventing characteristic degradation around a TSV.

According to some embodiments of the present inventive concept, a semiconductor device includes a substrate having a keep out zone (KOZ). A plurality of interconnections are formed outside the KOZ on the substrate. A TSV formed in the KOZ, and configured to pass through the substrate is disposed. A protection pattern electrically insulated from the TSV, formed in the KOZ, and having a different conductive material from the TSV is disposed. A lower end of the protection pattern is formed at a higher level than a lower end of the TSV.

In some embodiments, the protection pattern may include the same conductive material as the interconnections.

In some embodiments, the protection pattern and the interconnections may include tungsten (W). The TSV may include copper (Cu).

According to some embodiments, the protection pattern may be a relatively more active conductive material than the interconnections and the TSV in a galvanic table.

According to some embodiments, the protection pattern may be formed to surround the TSV.

According to some embodiments, the protection pattern may be formed between the TSV and the interconnections.

In some embodiments, upper ends of the protection pattern and the interconnections may be formed at the same horizontal level. The lower end of the protection pattern may be formed at the same horizontal level as a lower end of at least one of the interconnections.

In some embodiments, the protection pattern may contact the substrate.

According to some embodiments, an upper end of the TSV may protrude more than the protection pattern and the interconnections. A vertical deviation between the upper end of the TSV and the upper ends of the interconnections may be about 20 nm or less.

In some embodiments, the upper ends of the TSV, the protection pattern and the interconnections may be formed at the same horizontal level.

According to some embodiments, a first distance may denote a distance between the protection pattern and the TSV, and a second distance may denote a distance between the closest one of the interconnections and the protection pattern. The first distance may be smaller than the second distance.

In some embodiments, a third distance may denote a distance between the interconnections. The first distance may be greater than the third distance.

In some embodiments, a horizontal width of the protection pattern may be greater than a horizontal width of each interconnection.

According to some embodiments, an upper interconnection layer may be disposed on the TSV, the protection pattern and the interconnections. A lower surface of the upper interconnection layer may directly contact upper surfaces of the interconnections, the protection pattern and the TSV.

According to some embodiments, the upper interconnection layer may include an upper insulating layer, and an upper interconnection formed in the upper insulating layer and connected to the upper end of the TSV. The upper insulating layer may directly contact the upper surfaces of the protection pattern and the interconnections. The upper interconnection may directly contact the upper end of the TSV through the upper insulating layer.

In some embodiments, a semiconductor device includes a plurality of first patterns. The plurality of first patterns formed on a substrate, and having a first conductive material are disposed. A second pattern formed on the substrate, and having a second conductive material different from the first conductive material is disposed. A protection pattern formed between the first pattern and the second pattern on the substrate, configured to be relatively close to the second pattern, and having a third conductive material different from the second conductive material is disposed. One end of each of the first patterns, the second pattern, and the protection pattern is exposed at substantially the same horizontal level. The protection pattern is electrically isolated from the second pattern.

In some embodiments, the third conductive material may be the same as the first conductive material.

According to some embodiments, the third conductive material may be different from the first conductive material and the second conductive material. The third conductive material may be a relatively more active material than the first conductive material and the second conductive material in a galvanic table.

A semiconductor device includes a plurality of interconnections. The plurality of interconnections formed on a substrate, and having a first conductive material are disposed. A TSV formed on the substrate and having a second conductive material different from the first conductive material is disposed. A protection pattern formed between the interconnections and the TSV on the substrate, and having a third conductive material different from the first conductive material and the second conductive material is disposed. The third conductive material is located at a relatively more active location than the interconnections and the TSV in a galvanic table.

BRIEF DESCRIPTION OF THE DRAWINGS

FIG. 36 is a galvanic table for describing a semiconductor device according to some embodiments of the present inventive concept.

DETAILED DESCRIPTION

Figure 1:
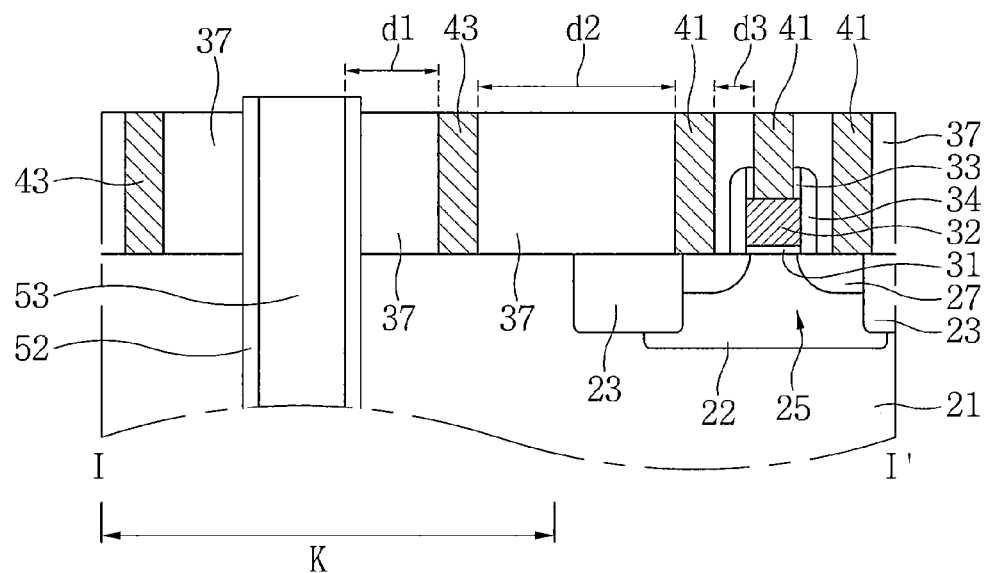
FIG. 1 is a cross-sectional view of a semiconductor device according to some embodiments of the present inventive concept.

Various embodiments will now be described with reference to the accompanying drawings in which some embodiments are shown. The present inventive concept may, however, be embodied in different forms and should not be construed as limited to the embodiments set forth herein. Rather, these embodiments are provided so that this disclosure will be thorough and complete and will convey the scope of the present inventive concept to those skilled in the art.

The terminology used herein is for the purpose of describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, steps, operations, elements, and/or components, but do not preclude the presence or addition of one or more other features, steps, operations, elements, components, and/or groups thereof.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. In the following explanation, the same reference numerals refer to the same components throughout the specification. As used herein, the term "and/or" includes any and all combinations of one or more of the associated listed items.

Spatially relative terms, such as "beneath," "below," "lower," "above," "upper," and the like, may be used herein for ease of description in describing one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Example embodiments will be described with reference to cross-sectional views or layouts that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but may include deviations in shapes that result, for example, from manufacturing. For example, an etching area illustrated at a right angle may be round or have a predetermined curvature. In the drawings, the sizes and relative sizes of layers and regions may be exaggerated for clarity. Forms of the embodiments may be modified by the manufacturing technology and/or tolerance.

Hereinafter, like reference numerals refer to like elements throughout. Therefore, although like reference numerals or similar reference numerals are not mentioned or described in the drawing, it will be described with reference to the other drawings. Further, although reference numerals are not illustrated, it will be described with reference to the other drawings.

Terms such as "front side" and "back side" may be used in a relative sense herein to facilitate easy understanding of the present inventive concept. Accordingly, "front side" and "back side" may not refer to any specific direction, location, or component, and may be used interchangeably. For example, "front side" may be interpreted as "back side" and vice versa. Also, "front side" may be expressed as "first side," and "back side" may be expressed as "second side," and vice versa. However, "front side" and "back side" cannot be used interchangeably in the same embodiment.

The term "near" is intended to mean that one among two or more components is located within relatively close proximity of a certain other component. For example, it should be understood that when a first end is near a first side, the first end may be closer to the first side than a second end, or the first end may be closer to the first side than to a second side.

Figure 2:
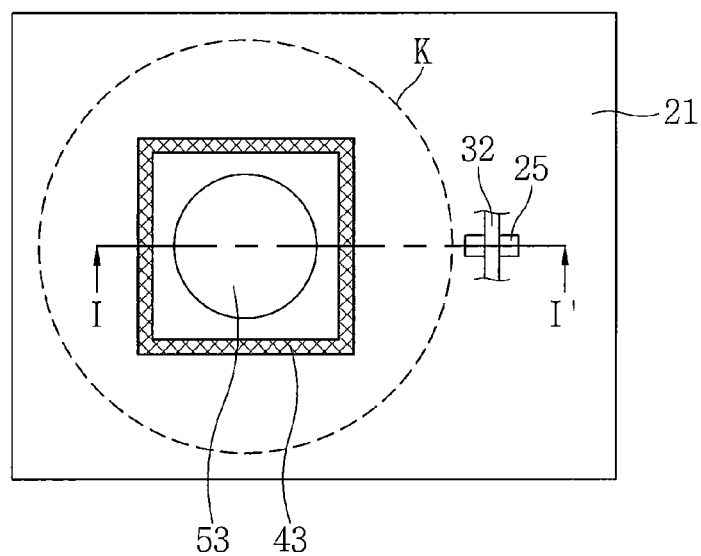
FIG. 2 is a layout of a semiconductor device according to some embodiments of the present inventive concept.

FIG. 1 is a cross-sectional view of a semiconductor device according to some embodiments of the present inventive concept. FIG. 2 is a layout of a semiconductor device according to some embodiments of the present inventive concept. FIG. 1 is the cross-sectional view taken along the line I-I' of FIG. 2. FIG. 36 is a galvanic table for describing the semiconductor device according to some embodiments of the present inventive concept.

Referring to FIGS. 1, 2, and 36, a semiconductor device according to some embodiments of the present inventive concept may include a substrate 21 including a keep out zone (KOZ) K, a well 22, an isolation layer 23, an active area 25, source/drain areas 27, a gate dielectric layer 31, a gate electrode 32, a capping pattern 33, a spacer 34, an interlayer insulating layer 37, interconnections 41, a protection pattern 43, a via insulating layer 52, and a through silicon via (TSV) 53.

The protection pattern 43, the via insulating layer 52, the TSV 53 may be formed in the KOZ K. The well 22, the active area 25, the source/drain areas 27, the gate dielectric layer 31, the gate electrode 32, the capping pattern 33, the spacer 34, and interconnections 41 may be formed outside the KOZ K.

The TSV 53 may completely pass through the interlayer insulating layer 37 and the substrate 21. The via insulating layer 52 may be formed to cover a side of the TSV 53. A lower end of the protection pattern 43 may be formed at the same horizontal level as that of at least one of the interconnections 41. The protection pattern 43 may have a rectangular shape surrounding the TSV 53. The protection pattern 43 may be formed between the TSV 53 and the interconnections 41. The protection pattern 43 may be spaced apart from the TSV 53. The protection pattern 43 may be electrically insulated from the TSV 53.

Upper ends of the protection pattern 43, the TSV 53, and the interconnections 41 may be exposed. The upper ends of the protection pattern 43, the interconnections 41, and the interlayer insulating layer 37 may be exposed to be substantially coplanar. Upper surfaces of the protection pattern 43, the interconnections 41, and the interlayer insulating layer 37 may be formed at substantially the same horizontal level. An upper end of the TSV 53 may protrude more than the upper ends of the protection pattern 43, the interconnections 41, and the interlayer insulating layer 37. In some embodiments, the upper end of the TSV 53 may protrude from the upper surface of the interlayer insulating layer 37. A vertical distance between the upper end of the TSV 53 and the upper ends of the interconnections 41 and the protection pattern 43 may be about 20 nm or less.

A first distance d1 may be a distance between the protection pattern 43 and the TSV 53, a second distance d2 may be a distance between one of the interconnections 41 that is closest to the protection pattern 43 and the protection pattern 43, and a third distance d3 may be a distance between two of the interconnections 41. The first distance d1 may be smaller than the second distance d2. The first distance d1 may be greater than the third distance d3. The first distance d1 may be greater than the third distance d3 and smaller than the second distance d2. A horizontal width of the protection pattern 43 may be the same as that of the one of the interconnections 41 that is closest to the protection pattern 43. A horizontal width of the TSV 53 may be greater than that of the protection pattern 43.

The protection pattern 43, the TSV 53, and the interconnections 41 may be simultaneously or concurrently exposed to a cleaning solution or an etching gas while performing a semiconductor manufacturing process. The protection pattern 43 may serve to reduce or possibly prevent galvanic corrosion of the interconnections 41. The protection pattern 43 may serve to reduce or possibly prevent adhesion of a by-product generated by the galvanic corrosion to the interconnections 41.

Galvanic corrosion is a phenomenon caused by accelerating an oxidation of one metal when different metals are in contact. The galvanic corrosion may be determined based on the galvanic table shown in FIG. 36. A more active metal is located nearer the top of the galvanic table and a less active metal is located nearer the bottom of the galvanic table shown in FIG. 36. A relatively more active metal in the galvanic table may cause relatively greater galvanic corrosion than another relatively less active metal when different metals are in contact. Contact between metals located further away from each other in the galvanic table may cause relatively greater galvanic corrosion than contact between metals located closer to each other in the galvanic table. Galvanic corrosion may accelerate generation of a by-product.

For example, the protection pattern 43 and the interconnections 41 may include substantially the same conductive material, and the TSV 53 may include a relatively more active conductive material than the protection pattern 43 and the interconnections 41 in the galvanic table. For example, the protection pattern 43 and the interconnections 41 may include tungsten (W), and the TSV 53 may include copper (Cu). Tungsten (W) corresponds to a relatively less active metal than copper (Cu) in the galvanic table. The TSV 53 may cause relatively greater galvanic corrosion. A distance between the protection pattern 43 and the TSV 53 may be smaller than a distance between the interconnections 41 and the TSV 53. The interconnections 41 may be protected from galvanic corrosion and by-product adhesion due to the protection pattern 43.

The protection pattern 43 and the interconnections 41 may include the same conductive material, and the TSV 53 may include a relatively less active conductive material than the protection pattern 43 and the interconnections 41 in the galvanic table. The distance between the protection pattern 43 and the TSV 53 may be smaller than a distance between the protection pattern 43 and the interconnections 41. The protection pattern 43 may cause relatively greater galvanic corrosion. The interconnections 41 and the TSV 53 may be protected from galvanic corrosion and by-product adhesion due to the protection pattern 43.

FIGS. 3 through 6 are enlarged views of a portion of FIG. 1.

Figure 3:
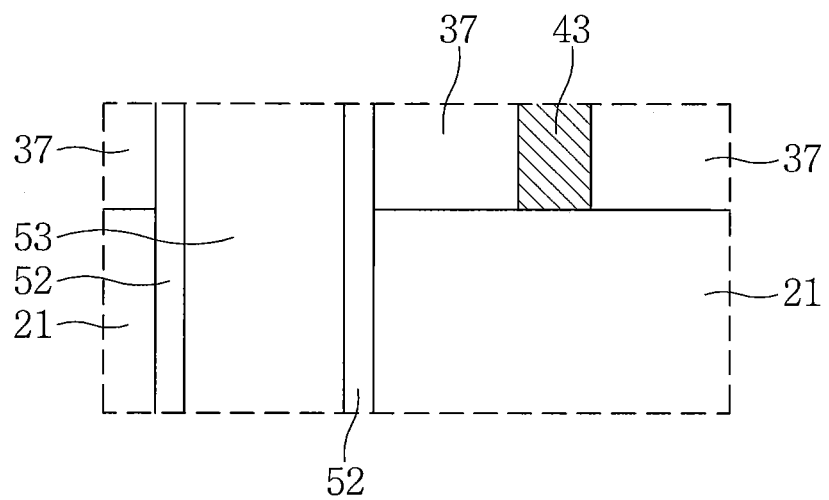
FIGS. 3 through 6 are enlarged views of a portion of FIG. 1.

Referring to FIG. 3, the protection pattern 43 may contact an upper end of the substrate 21 through the interlayer insulating layer 37.

Figure 4:
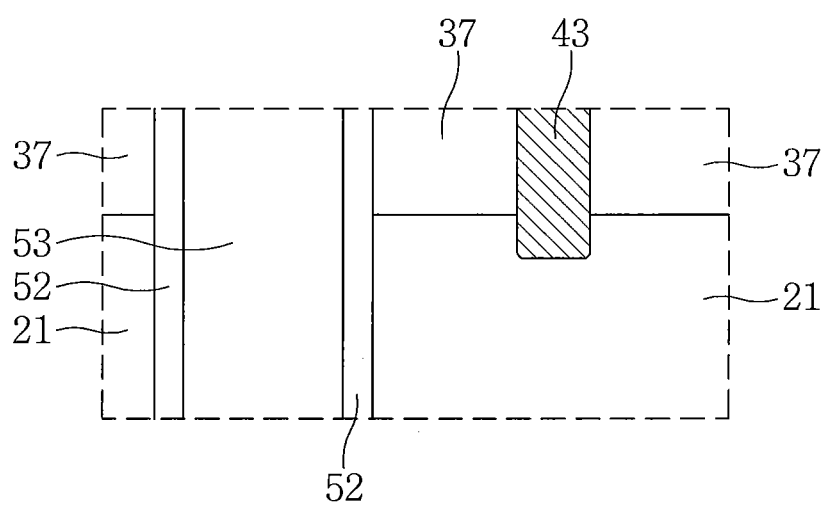

Referring to FIG. 4, the protection pattern 43 may be formed in the substrate 21 through the interlayer insulating layer 37. A lower end of the protection pattern 43 may be formed at a lower level than the upper end of the substrate 21. Stated in other words, a lower portion of the protection pattern 43 may be in the substrate 21 such that the substrate 21 may surround the lower portion of the protection pattern 43. An upper portion of the protection pattern 43 may be in the interlayer insulating layer 37.

Figure 5:
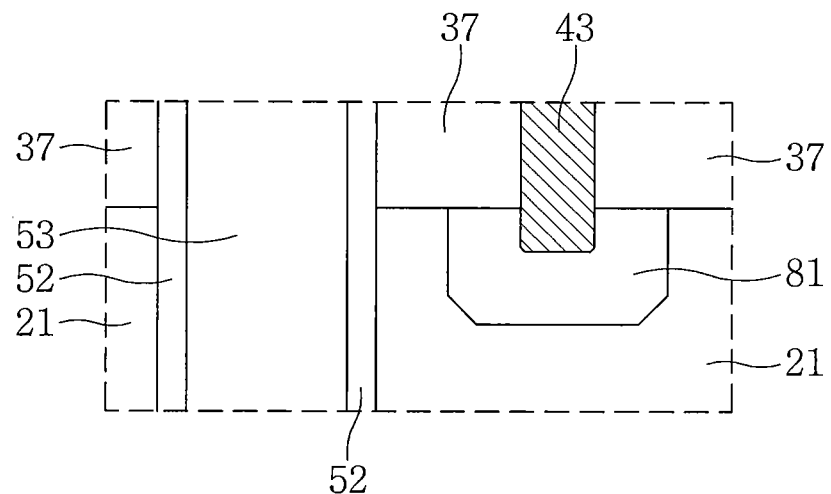

Referring to FIG. 5, the substrate 21 may include a high concentration impurity area 81. The protection pattern 43 may directly contact the high concentration impurity area 81. The high concentration impurity area 81 may include an N-type impurity or a P-type impurity.

Figure 6:
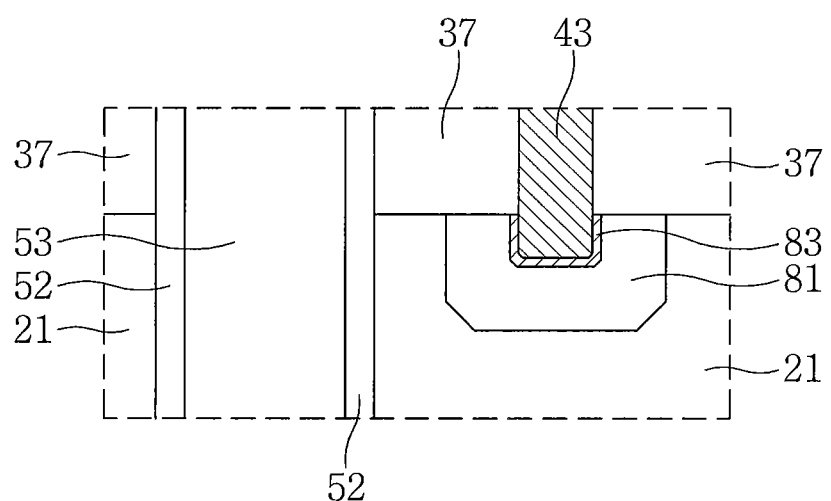

Referring to FIG. 6, a metal silicide layer 83 may be formed between the protection pattern 43 and the high concentration impurity area 81.

FIGS. 7 through 11 are cross-sectional views of a semiconductor device according to some embodiments of the present inventive concept.

Figure 7:
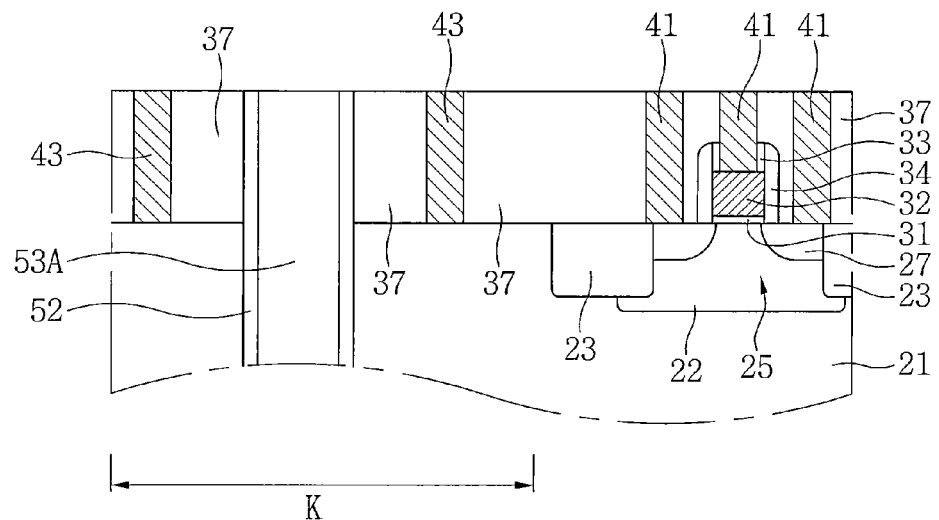
FIGS. 7 through 11 are cross-sectional views of a semiconductor device according to some embodiments of the present inventive concept.

Referring to FIG. 7, upper ends of a protection pattern 43, a TSV 53A, interconnections 41, and an interlayer insulating layer 37 may be exposed to be coplanar. Stated in other words, the upper ends of a protection pattern 43, a TSV 53A, interconnections 41, and an interlayer insulating layer 37 may be coplanar.

Figure 8:
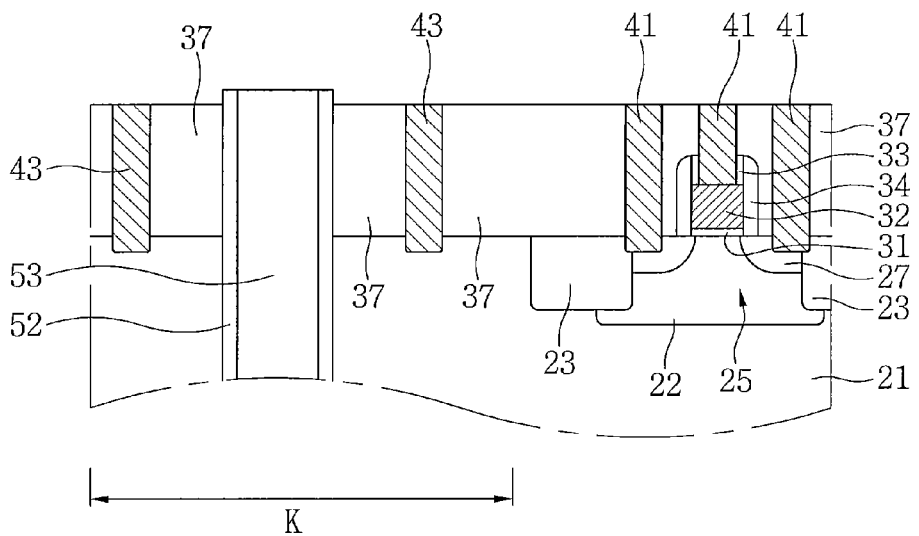

Referring to FIG. 8, the protection pattern 43 may be formed in a substrate 21 through the interlayer insulating layer 37. A lower end of the protection pattern 43 may be formed at a lower level than an upper end of the substrate 21. The lower end of the protection pattern 43 may be formed at the same horizontal level as a lower end of at least one of the interconnections 41. Stated in other words, a lower portion of the protection pattern 43 may be in the substrate 21 such that the substrate may surround the lower portion of the protection pattern 43. An upper portion of the protection pattern 43 may be in the interlayer insulating layer 37.

Figure 9:
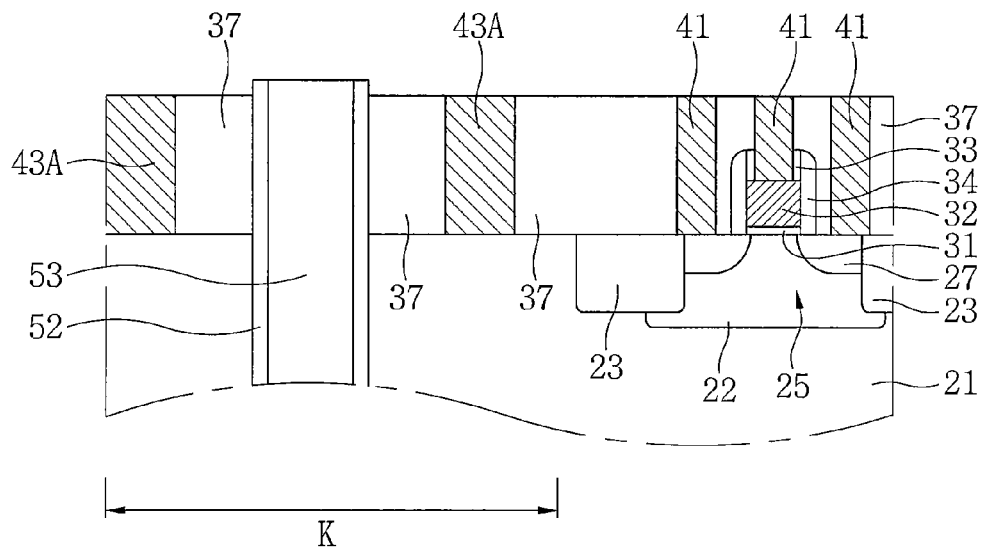

Referring to FIG. 9, a protection pattern 43A may have a horizontal width greater than a horizontal width of the interconnections 41.

Figure 10:
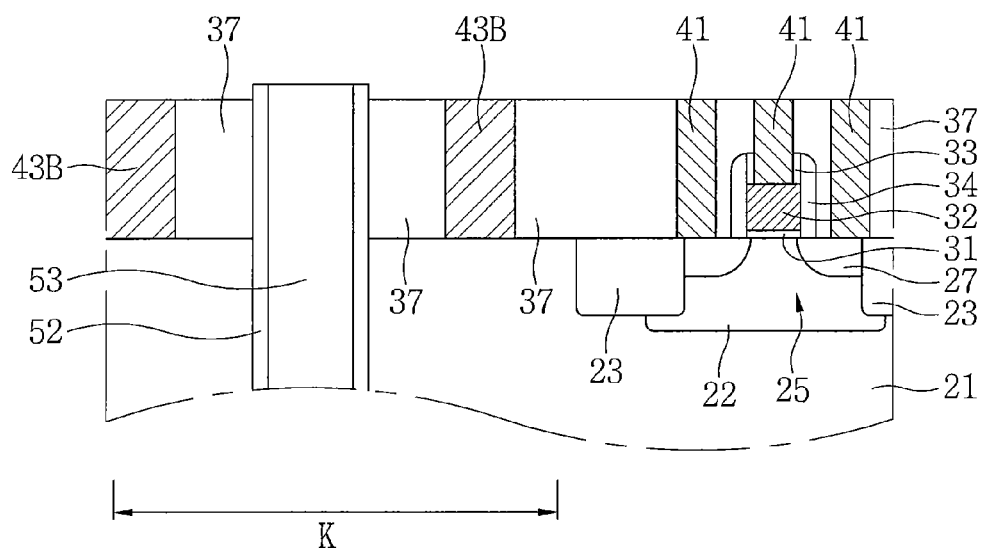

Referring to FIG. 10, a protection pattern 43B may include a different conductive material from the interconnections 41 and a TSV 53.

For example, the protection pattern 43B may include a relatively more active conductive material than the protection pattern 43 and the TSV 53 in the galvanic table. The protection pattern 43B may cause relatively greater galvanic corrosion. The interconnections 41 and the TSV 53 may be protected from galvanic corrosion and by-product adhesion due to the protection pattern 43B. The protection pattern 43B may be referred to as a sacrificial anode.

Figure 11:
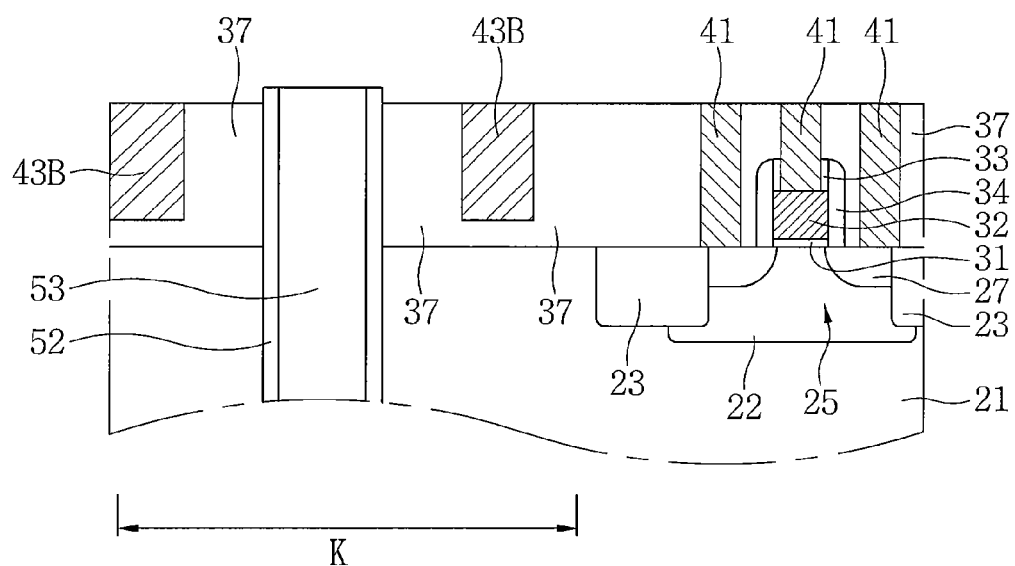

Referring to FIG. 11, the protection pattern 43B may be formed in the interlayer insulating layer 37. A lower end of the protection pattern 43B may be formed at a different level from those of the interconnections 41. The protection pattern 43B may be electrically insulated from the substrate 21. The interlayer insulating layer 37 may remain between the protection pattern 43B and the substrate 21.

FIGS. 12 through 16 are layouts of a semiconductor device according to some embodiments of the present inventive concept.

Figure 12:
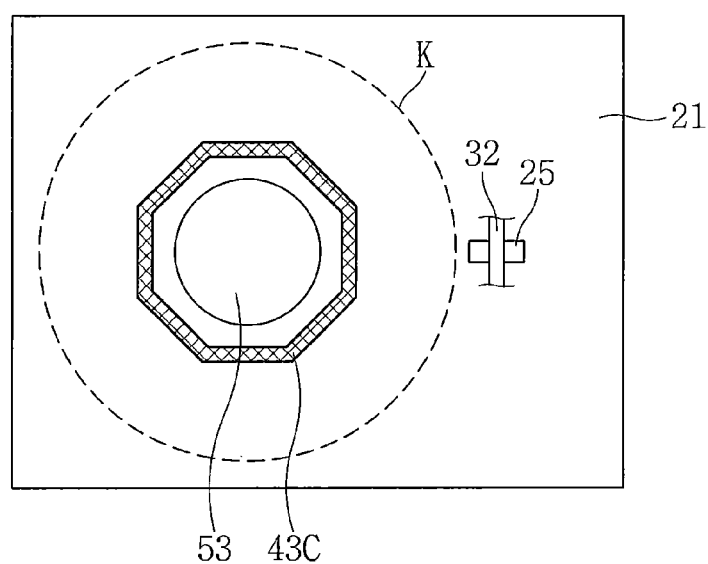
FIGS. 12 through 16 are layouts of a semiconductor device according to some embodiments of the present inventive concept.

Referring to FIG. 12, a protection pattern 43C may have an octagonal shape surrounding a TSV 53.

Figure 13:
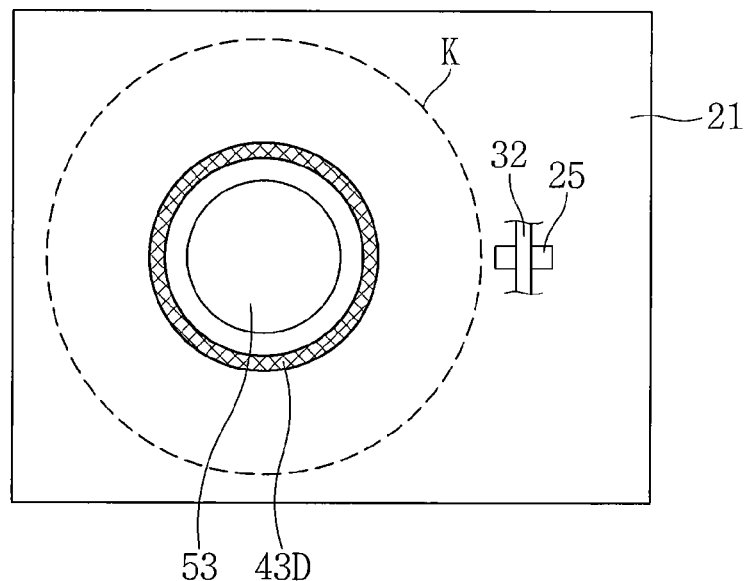

Referring to FIG. 13, a protection pattern 43D may have a circular shape surrounding a TSV 53.

Figure 14:
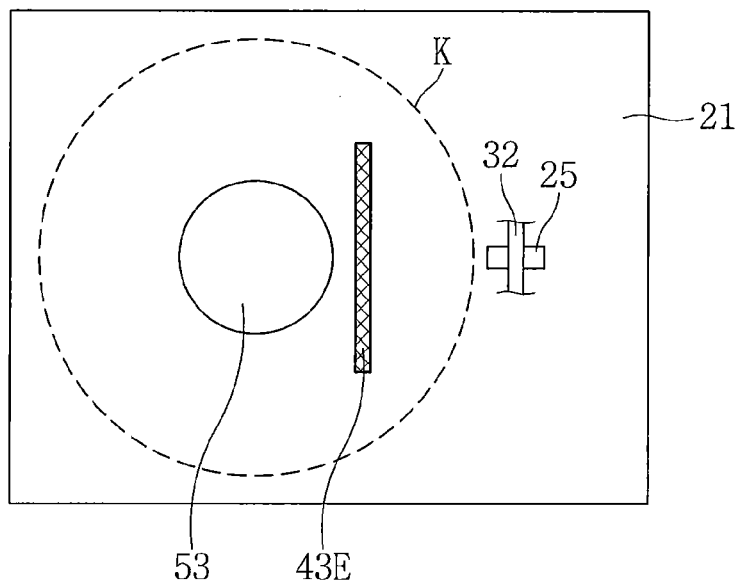

Referring to FIG. 14, a protection pattern 43E may have a bar shape formed between a TSV 53 and interconnections 41.

Figure 15:
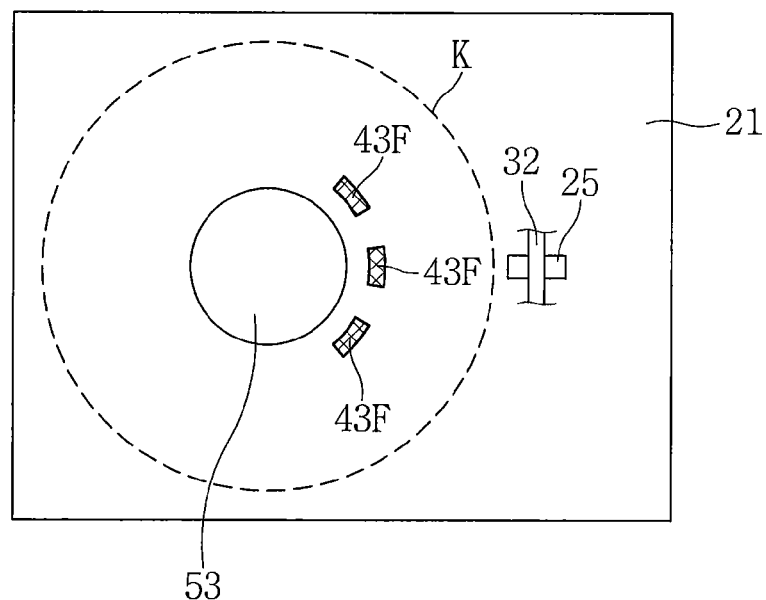

Referring to FIG. 15, protection patterns 43F may be formed between a TSV 53 and interconnections 41. The protection patterns 43F may be spaced apart from each other.

Figure 16:
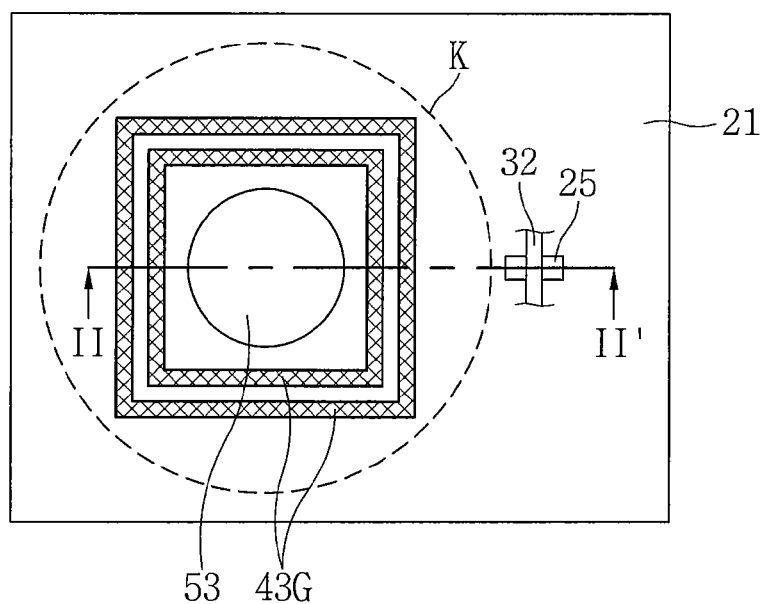
Figure 17:
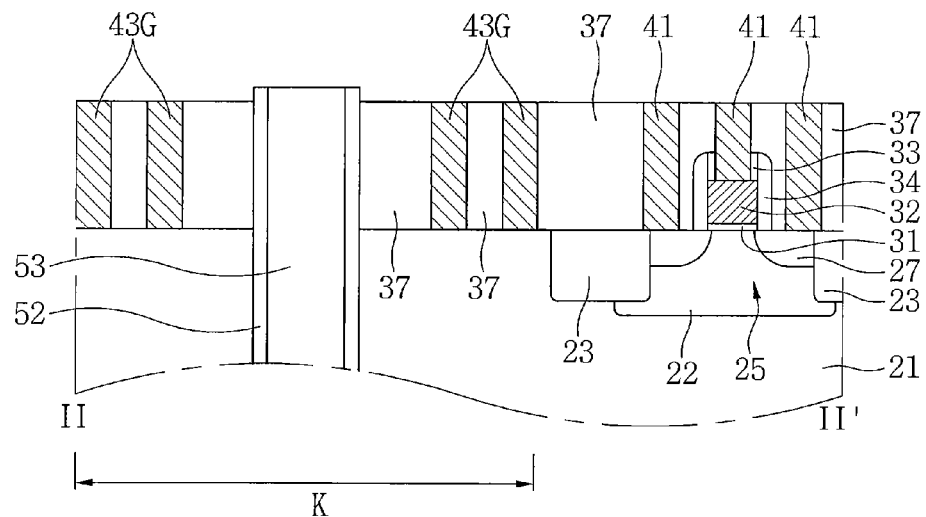
FIG. 17 is a cross-sectional view taken along the line of FIG. 16.

FIG. 17 is a cross-sectional view taken along the line II-II' of FIG. 16.

Referring to FIGS. 16 and 17, a protection pattern 43G may have a double rectangular shape. Stated in other Words, the protection pattern 43G may include two rectangular shaped patterns.

Figure 18:
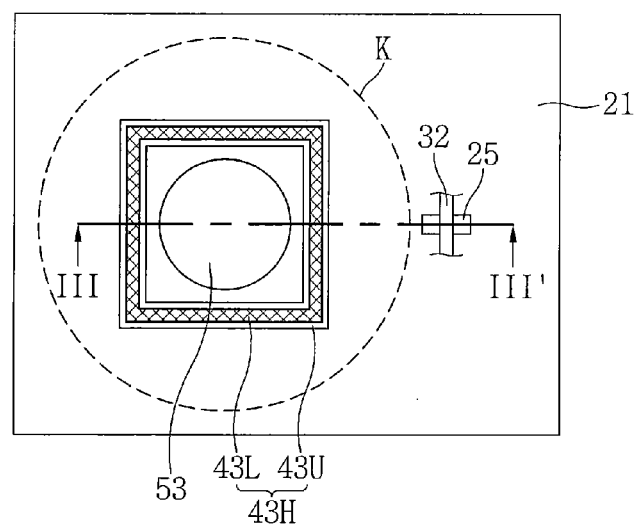
FIG. 18 is a layout of a semiconductor device according to some embodiments of the present inventive concept.
Figure 19:
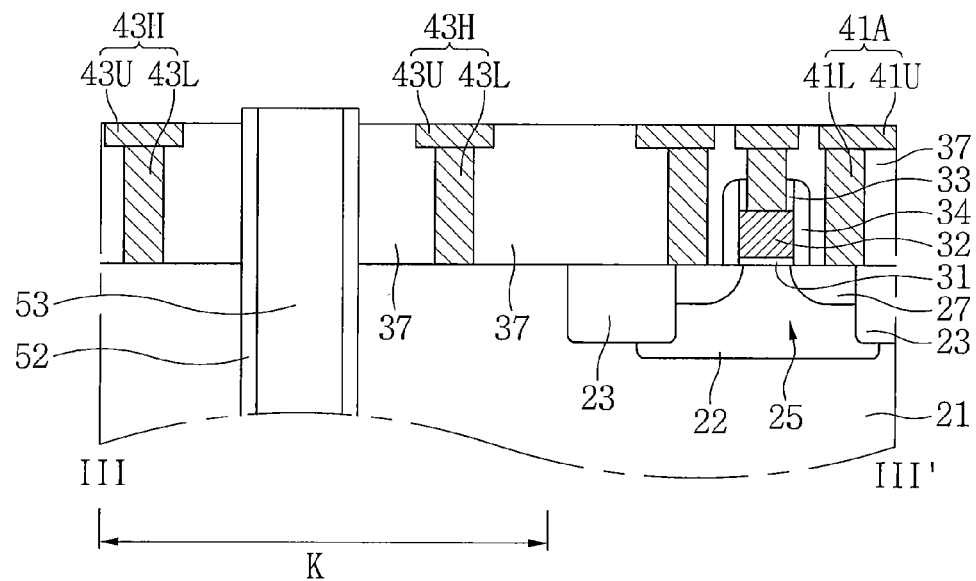
FIGS. 19 and 20 are cross-sectional views taken along the line of FIG. 18.
Figure 20:
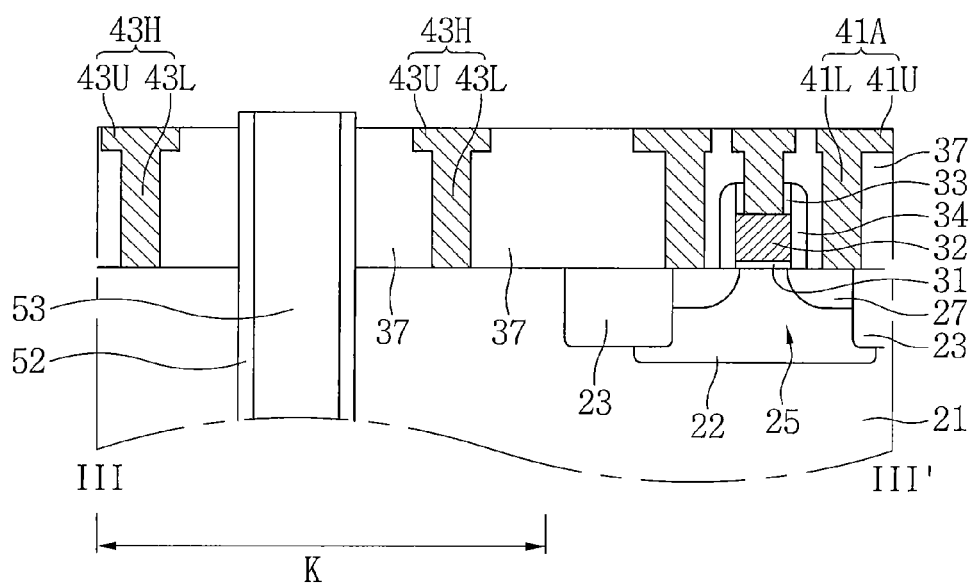

FIG. 18 is a layout of a semiconductor device according to some embodiments of the present inventive concept, and FIGS. 19 and 20 are cross-sectional views taken along the line of FIG. 18.

Referring to FIGS. 18 and 19, a protection pattern 43H may include an upper part 43U and a lower part 43L. The lower part 43L may contact a substrate 21 and the upper part 43U. The lower part 43L may be between the substrate 21 and the upper part 43U. Each of interconnections 41A may include a plug 41L and a horizontal interconnection 41U. The horizontal interconnection 41U may contact an upper part of the plug 41L. The plug 41L may be between the horizontal interconnection 41U and the substrate 21. The upper part 43U, a TSV 53, and the horizontal interconnection 41U may be simultaneously or concurrently exposed to a cleaning solution or an etching gas atmosphere while performing a semiconductor manufacturing process.

Referring to FIG. 20, an upper part 43U may be formed to combine with the lower part 43L. Stated in other words, a protection pattern 43H may be unitary including the upper part 43U and a lower part 43L. A horizontal interconnection 41U may be formed to combine with a plug 41L. Each of the interconnections 41A may be unitary including the horizontal interconnection 41U and the plug 41L.

Figure 21:
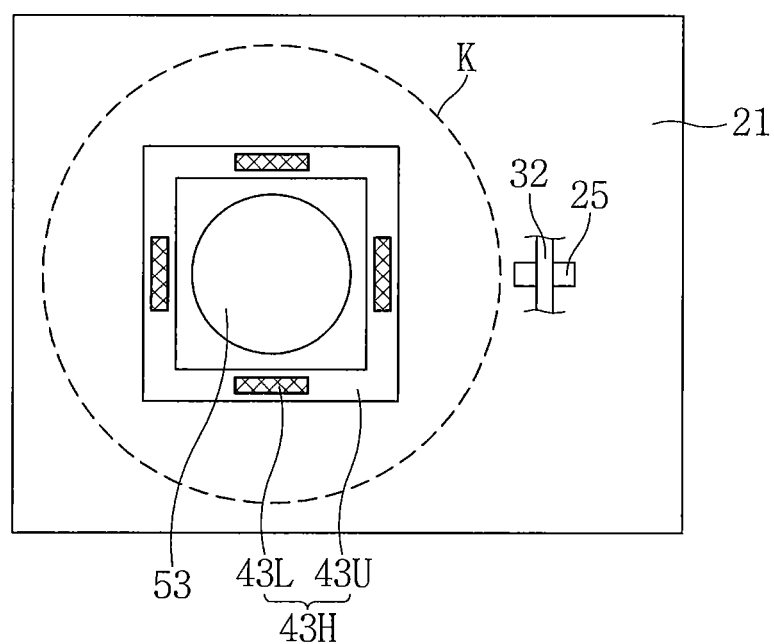
FIGS. 21 and 22 are layouts of a semiconductor device according to some embodiments of the present inventive concept.
Figure 22:
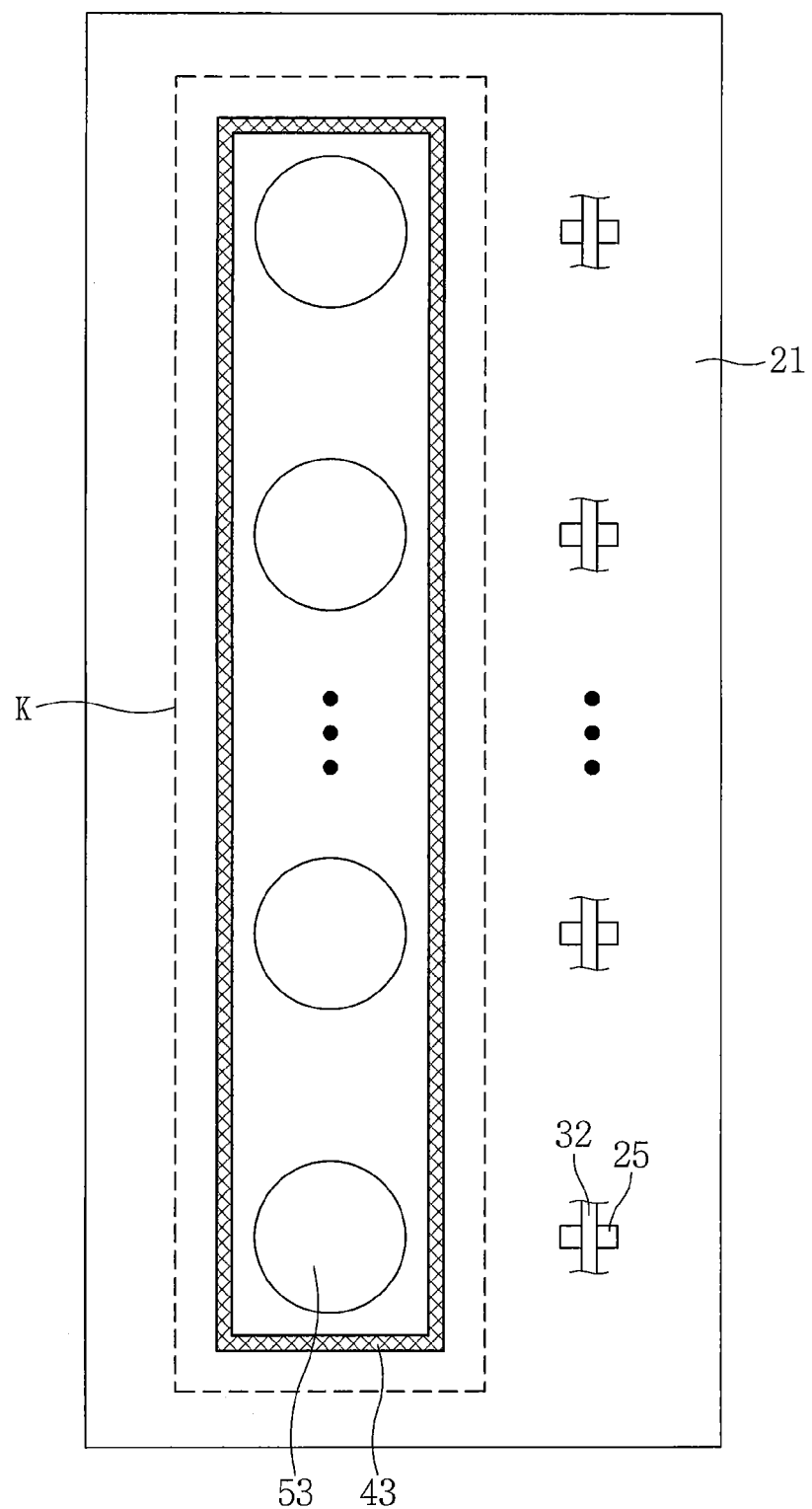

FIGS. 21 and 22 are layouts of a semiconductor device according to some embodiments of the present inventive concept.

Referring to FIG. 21, an upper part 43U may be formed to completely surround a TSV 53. Lower parts 43L may be formed around the TSV 53.

Referring to FIG. 22, TSVs 53 may be formed in a KOZ K. A protection pattern 43 may surround the TSVs 53. Active areas 25 and gate electrodes 32 may be formed outside of the KOZ K on a substrate 21.

FIGS. 23 to 33 are cross-sectional views, which are taken along the line I-I' of FIG. 2, illustrating a method of forming a semiconductor device according to some embodiments of the present inventive concept.

Figure 23:
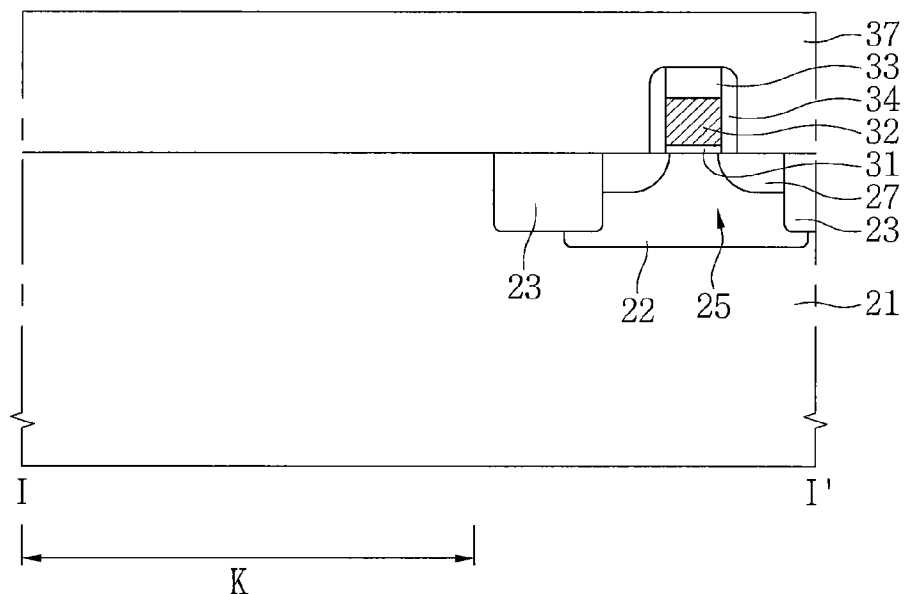
FIGS. 23 through 33 are cross-sectional views, which are taken along the line I-I' of FIG. 2, illustrating a method of forming a semiconductor device according to some embodiments of the present inventive concept.

Referring to FIGS. 2 and 23, a substrate 21 including the KOZ K may be provided. The substrate 21 may include a well 22, an active area 25, and source/drain areas 27. The active area 25 may be formed in the well 22 and defined by an isolation layer 23. A gate dielectric layer 31, a gate electrode 32, a capping pattern 33, a spacer 34, and an interlayer insulating layer 37 may be formed on the substrate 21. The well 22, the active area 25, the source/drain areas 27, the gate dielectric layer 31, the gate electrode 32, the capping pattern 33, and the spacer 34 may be formed outside of the KOZ K.

The substrate 21 may be a semiconductor substrate such as a silicon wafer. For example, the substrate 21 may have a single-crystalline silicon wafer having a P-type impurity. The well 22 may be formed by, for example, implanting an N-type impurity or a P-type impurity into a predetermined area of the substrate 21. The isolation layer 23 may be formed using, for example, a shallow trench isolation (STI) technique. For example, the isolation layer 23 may include silicon oxide, silicon nitride, silicon oxynitride, or a combination thereof. The gate electrode 32 may cross the active area 25. The gate dielectric layer 31 may be formed between the gate electrode 32 and the active area 25. The capping pattern 33 may cover the gate electrode 32. The spacer 34 may cover sides of the gate electrode 32 and the capping pattern 33. The source/drain areas 27 may be formed in the active area 25 adjacent the gate electrode 32. The source/drain areas 27 may be disposed outside of the gate electrode 32.

The source/drain areas 27 may include impurities having conductivity different from conductivity of impurities included in the active area 25. For example, the active area 25 may include single-crystalline silicon including a P-type impurity, and the source/drain areas 27 may include a semiconductor layer including an N-type impurity. The active area 25 may include single-crystalline silicon including an N-type impurity, and the source/drain areas 27 may include a semiconductor layer including a P-type impurity.

The gate dielectric layer 31 may include silicon oxide, silicon nitride, silicon oxynitride, high-K dielectrics, or a combination thereof. The gate electrode 32 may include a metal, a metal nitride, a metal silicide, poly-silicon, conductive carbon, or a combination thereof. The capping pattern 33 may include silicon oxide, silicon nitride, silicon oxynitride, or a combination thereof. The spacer 34 may include silicon oxide, silicon nitride, silicon oxynitride, or a combination thereof.

In some embodiments, the interlayer insulating layer 37 may cover an entire surface of the substrate 21. The interlayer insulating layer 37 may be single-layered or multi-layered. The interlayer insulating layer 37 may include silicon oxide, silicon nitride, silicon oxynitride, low-K dielectrics, or a combination thereof.

Figure 24:
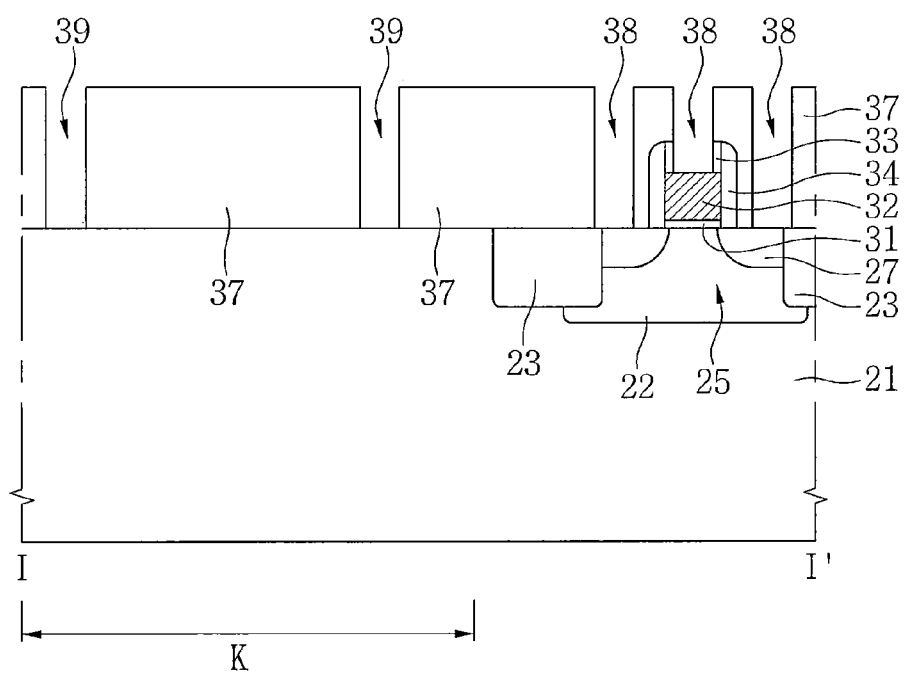

Referring to FIGS. 2 and 24, first holes 38 and second holes 39 may be formed and may pass through the interlayer insulating layer 37. The first holes 38 may be formed outside of the KOZ K, and the second holes 39 may be formed in the KOZ K. The first holes 38 and the second holes 39 may be formed using a photolithography process and an etching process.

One of the first holes 38 may expose the gate electrode 32 sequentially through the interlayer insulating layer 37 and capping pattern 33. Some of the first holes 38 may expose the source/drain areas 27 through the interlayer insulating layer 37. The second holes 39 may expose the substrate 21 through the interlayer insulating layer 37. Bottoms of the second holes 39 may be formed at substantially the same horizontal level as that of at least one of the first holes 38. In some embodiments, the bottoms of the second holes 39 and a bottom of the at least one of the first hole 38 may be disposed at substantially the same height relative to an upper end of the substrate 21. The upper end of the substrate 21 may refer to an upper surface of the substrate 21.

In some embodiments, the second holes 39 may be formed in the interlayer insulating layer 37. The interlayer insulating layer 37 may be exposed to the bottoms of the second holes 39. The second holes 39 may completely pass through the interlayer insulating layer 37, and may be formed in the substrate 21. Lower ends of the second holes 39 may be formed at a lower level than the upper end of the substrate 21.

Figure 25:
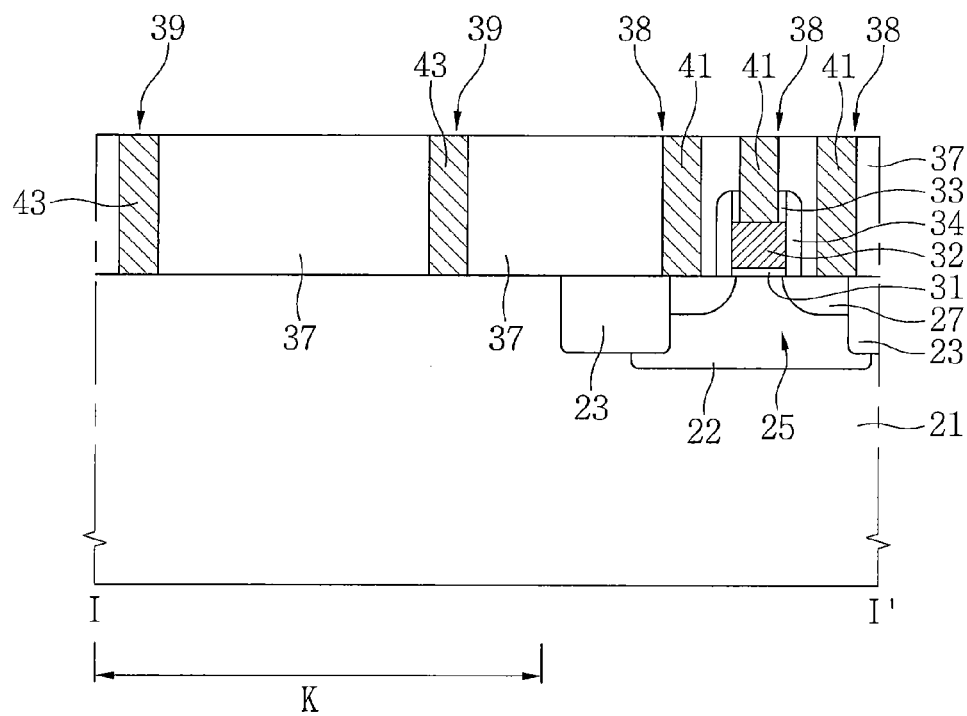

Referring to FIGS. 2 and 25, interconnections 41 may be formed in the first holes 38, and protection patterns 43 may be formed in the second holes 39. The formation of the interconnections 41 and the protection patterns 43 may include a thin film formation process and a planarization process. The planarization process may include a chemical mechanical polishing (CMP) process, an etch-back process, or a combination thereof. Upper surfaces of the interlayer insulating layer 37, the interconnections 41, and the protection patterns 43 may be exposed to be coplanar. In some embodiments, the upper surfaces of the interlayer insulating layer 37, the interconnections 41, and the protection patterns 43 may be disposed at substantially the same level relative to the upper end of the substrate 21. Lower ends of the protection patterns 43 may be formed at the same horizontal level as that of at least one of the interconnections 41.

Each of the interconnections 41 and the protection patterns 43 may include a metal, a metal nitride, a metal silicide, conductive carbon, poly-silicon, or a combination thereof. The interconnections 41 and the protection patterns 43 may include substantially the same material. For example, the interconnections 41 and the protection patterns 43 may include tungsten (W).

In some embodiments, the protection patterns 43 may include a different material from the interconnections 41.

In some embodiments, the interconnections 41 and the protection patterns 43 may be formed in multilayers. For example, each of the interconnections 41 and the protection patterns 43 may include Ti/TiN/W.

In some embodiments, the protection patterns 43 may be formed in the interlayer insulating layer 37. The lower ends of the protection patterns 43 may contact the interlayer insulating layer 37. The protection patterns 43 may completely pass through the interlayer insulating layer 37, and may be formed in the substrate 21. Lower ends of the protection patterns 43 may be formed at a lower level than the upper end of the substrate 21.

Figure 26:
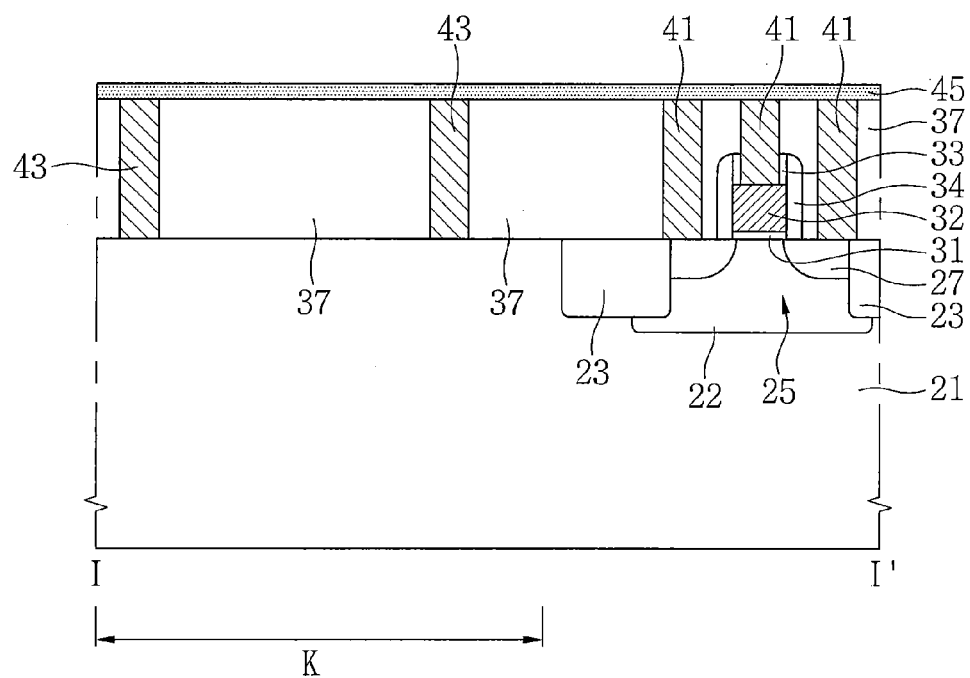

Referring to FIGS. 2 and 26, an etch stop layer 45 may be formed on the interlayer insulating layer 37, the interconnections 41, and the protection patterns 43. In some embodiments, the etch stop layer 45 may cover the interlayer insulating layer 37, the interconnections 41, and the protection patterns 43.

The etch stop layer 45 may include a different material from the interlayer insulating layer 37. For example, the interlayer insulating layer 37 may include silicon oxide, and the etch stop layer 45 may include silicon nitride having a thickness in a range of about 1 nm to about 20 nm. In some embodiments, the etch stop layer 45 may cover an entire surface of the substrate 21.

Figure 27:
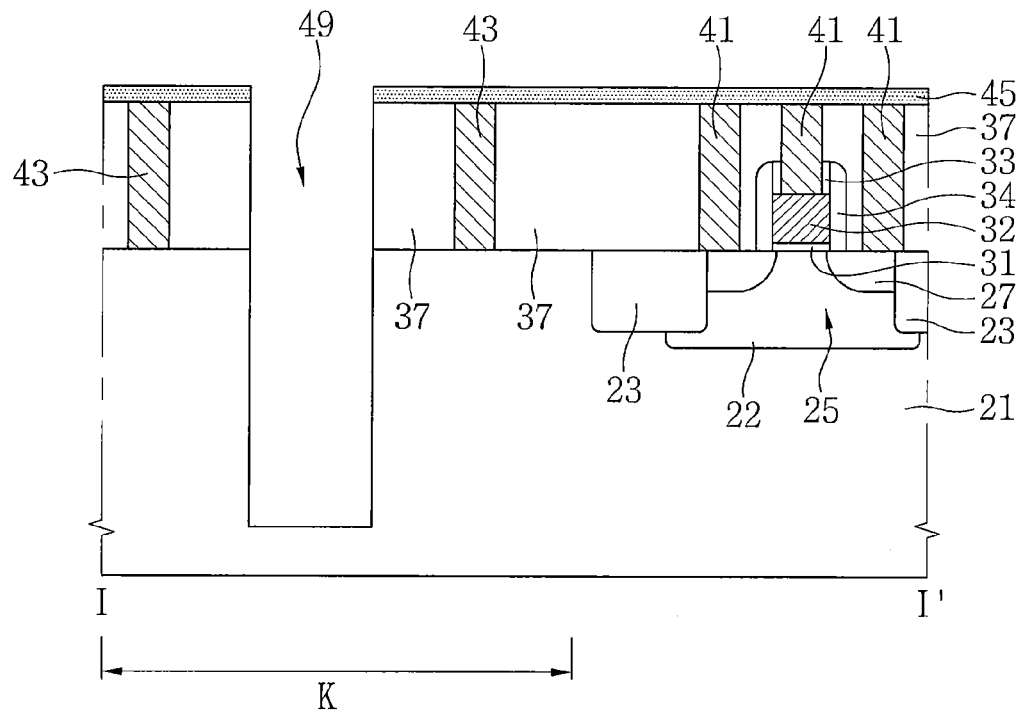

Referring to FIGS. 2 and 27, a via hole 49 may be formed in the etch stop layer 45, the interlayer insulating layer 37, and the substrate 21. The via hole 49 may be formed in the KOZ K. The via hole 49 may pass through the etch stop layer 45 and the interlayer insulating layer 37, and may be formed in the substrate 21. A bottom of the via hole 49 may be formed at a lower level than the upper end of the substrate 21. The substrate 21 may be exposed at the bottom of the via hole 49. The via hole 49 may have a relatively greater horizontal width than each of the interconnections 41 and the protection patterns 43. The formation of the via hole 49 may include a patterning process. The via hole 49 may be spaced apart from the protection patterns 43. The lower end of the via hole 49 may be formed at a lower level than the lower ends of the protection patterns 43.

Figure 28:
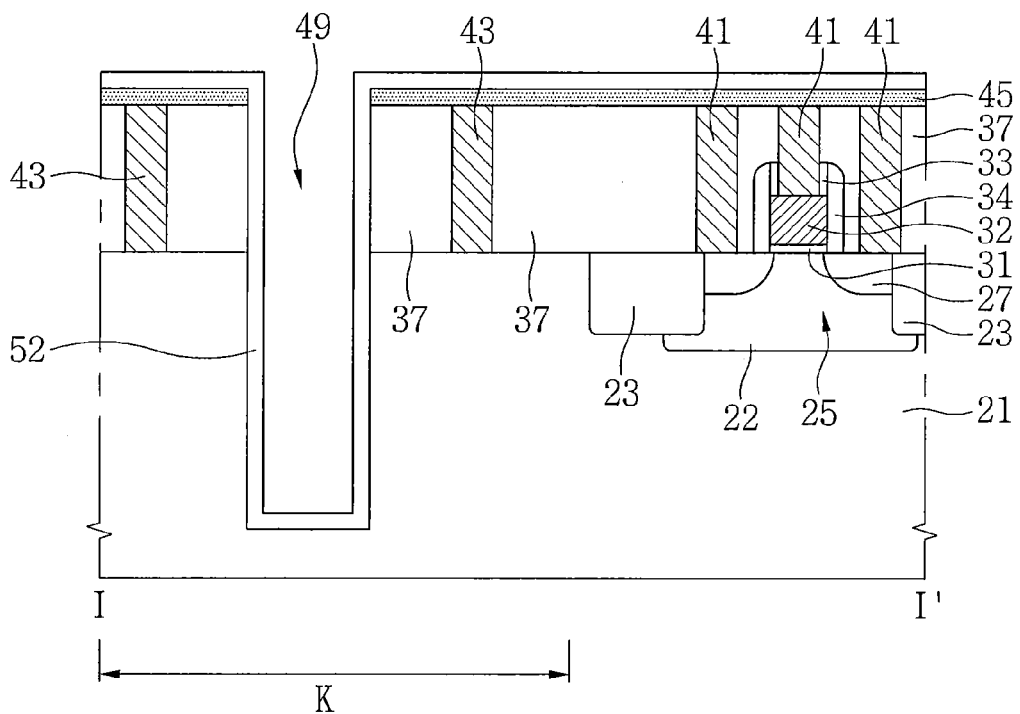

Referring to FIGS. 2 and 28, a via insulating layer 52 may be formed on a side wall of the via hole 49 and the etch stop layer 45. In some embodiments, the via insulating layer 52 may cover the side wall of the via hole 49 and the etch stop layer 45. The via insulating layer 52 may include, for example, silicon oxide, silicon nitride, silicon oxynitride, or a combination thereof.

Figure 29:
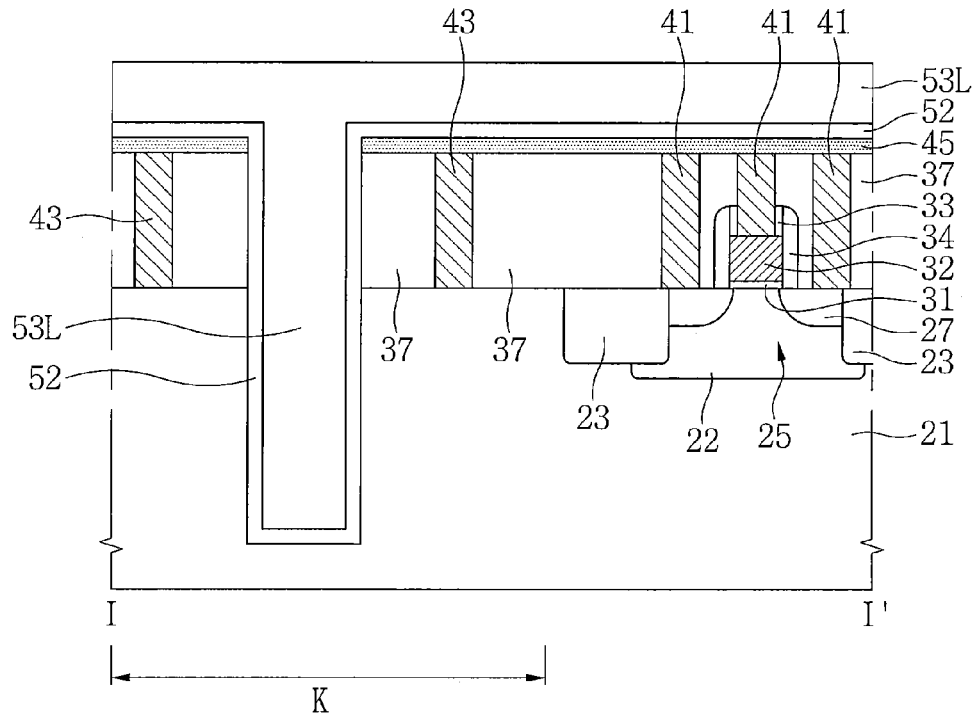

Referring to FIGS. 2 and 29, an electrode layer 53L may be formed on the via insulating layer 52 in the via hole 49. In some embodiments, the electrode layer 53L may fill the via hole 49. In some embodiments, the electrode layer 53L may completely fill the via hole 49 and may cover the etch stop layer 45. The electrode layer 53L may include, for example, a metal, a metal nitride, a metal sificide, conductive carbon, poly-silicon, or a combination thereof. The electrode layer 53L may include a different material from the interconnections 41. In some embodiments, the interconnections 41 may include tungsten (W), and the electrode layer 53L may include copper (Cu).

In some embodiments, the electrode layer 53L may include a different material from the protection patterns 43.

Figure 30:
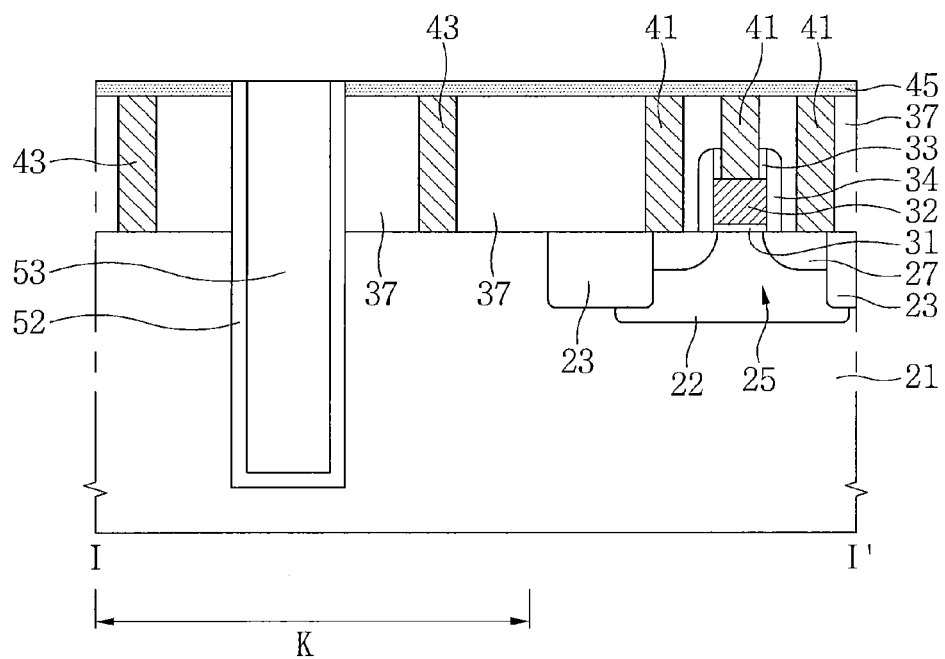

Referring to FIGS. 2 and 30, a TSV 53 may be formed by partially removing the electrode layer 53L.

For example, the formation of the TSV 53 may include a process of planarizing the electrode layer 53L and the via insulating layer 52 until the etch stop layer 45 is exposed. Upper surfaces of the TSV 53 and the etch stop layer 45 may be exposed to be coplanar. The TSV 53 may remain in the via hole 49. In some embodiments, a CMP process, an etch-back process, or a combination thereof may be applied to the planarization of the electrode layer 53L and the via insulating layer 52.

Figure 31:
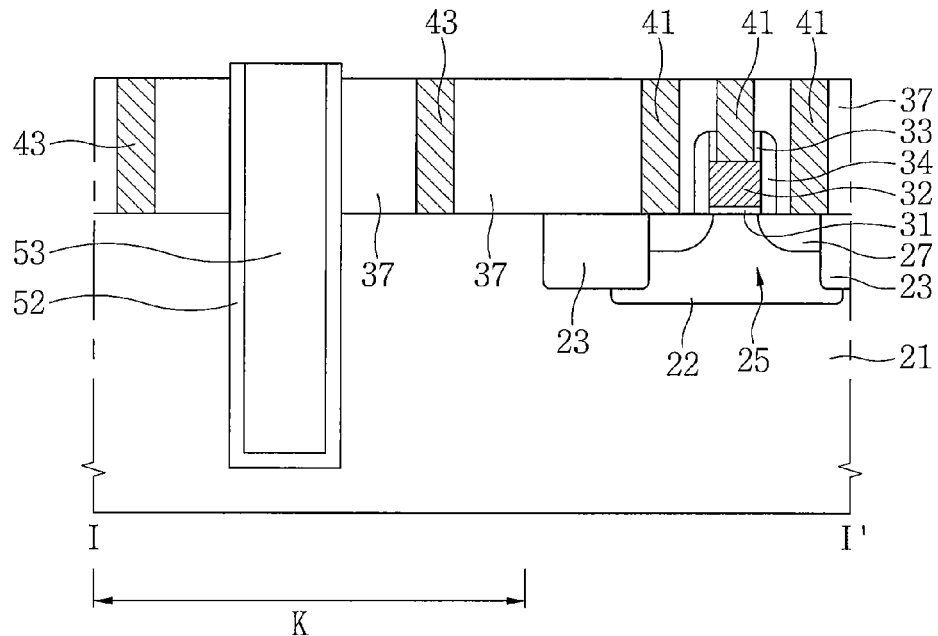

Referring to FIGS. 2 and 31, upper ends of the interconnections 41 and the protection patterns 43 may be exposed by removing the etch stop layer 45. In some embodiments, an etch-back process, a cleaning process, or a combination thereof may be applied to remove the etch stop layer 45. An upper end of the TSV 53 may protrude more than the upper ends of the protection patterns 43. The upper end of the TSV 53 may be protrude from an upper surface of the interlayer insulating layer 37 and may be disposed at a level higher than the upper ends of the protection patterns 43 relative to the upper end of the substrate 21. A vertical deviation between the upper end of the TSV 53 and the upper ends of the interconnections 41 and the protection patterns 43 may be about 20 nm or less. In some embodiments, a vertical distance between the upper end of the TSV 53 and one of the upper ends of the interconnections 41 and the protection patterns 43 may be about 20 nm or less. The protection patterns 43 may serve to reduce or possibly prevent a by-product of the galvanic corrosion from adhering to the interconnections 41 while removing the etch stop layer 45.

For example, galvanic corrosion may be caused between the protection patterns 43 and the TSV 53 while removing the etch stop layer 45. Galvanic corrosion is a phenomenon caused by accelerating an oxidation of one metal when different metals are in contact. The galvanic corrosion may be determined based on the galvanic table shown in FIG. 36. A more active metal is located nearer the top of the galvanic table and a less active metal is located nearer the bottom of the galvanic table shown in FIG. 36. A relatively more active metal in the galvanic table may cause relatively greater galvanic corrosion than another relatively less active metal when different metals are in contact. Contact between metals located further away from each other in the galvanic table may cause relatively greater galvanic corrosion than contact between metals located closer to each other in the galvanic table. Galvanic corrosion may accelerate generation of a by-product.

In some embodiments, the protection patterns 43 and the interconnections 41 may include the same conductive material, and the TSV 53 may include a relatively more active conductive material than the protection patterns 43 and the interconnections 41 in the galvanic table. For example, the protection patterns 43 and the interconnections 41 may include tungsten (W), and the TSV 53 may include copper (Cu). Tungsten (W) corresponds to a relatively less active metal than copper (Cu) in the galvanic table. The TSV 53 may cause relatively greater galvanic corrosion. A distance between the protection patterns 43 and the TSV 53 may be smaller than a distance between the interconnections 41 and the TSV 53. The interconnections 41 may be protected from galvanic corrosion and by-product adhesion due to the protection patterns 43.

In some embodiments, the protection patterns 43 and the interconnections 41 may include the same conductive material, and the TSV 53 may include a relatively less active conductive material than the protection patterns 43 and the interconnections 41 in the galvanic table. The protection patterns 43 may cause relatively greater galvanic corrosion. The interconnections 41 may be protected from galvanic corrosion and by-product adhesion due to the protection patterns 43.

Figure 32:
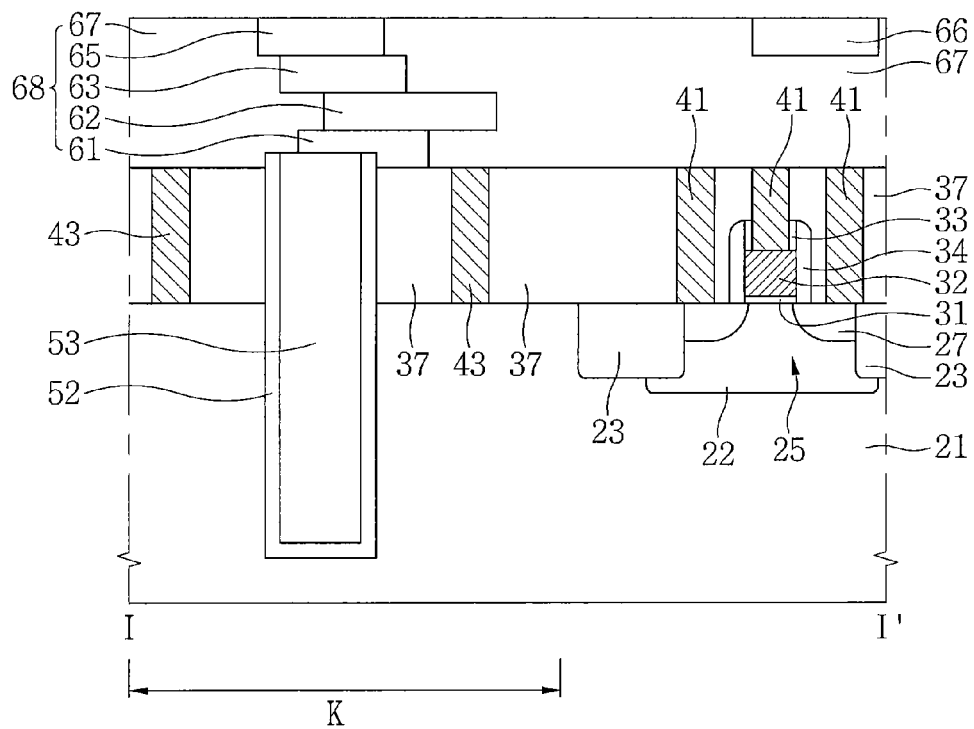

Referring to FIGS. 2 and 32, an upper interconnection layer 68 may be formed on the interlayer insulating layer 37, the interconnections 41, the protection patterns 43, and the TSV 53. The upper interconnection layer 68 may be referred to as a redistribution layer (RDL). The upper interconnection layer 68 may include an upper insulating layer 67, upper interconnections 61, 62, and 63, and landing pads 65 and 66. The protection patterns 43 may be spaced apart from the TSV 53. The protection patterns 43 may be electrically insulated from the TSV 53. The protection patterns 43 may be spaced apart from the upper interconnections 61, 62, and 63 and the landing pads 65 and 66. The protection patterns 43 may be electrically insulated from the upper interconnections 61, 62, and 63 and the landing pads 65 and 66.

In some embodiments, a lower surface of the upper interconnection layer 68 may directly contact the upper surfaces of the interlayer insulating layer 37, the interconnections 41, the protection patterns 43, and the TSV 53. The upper insulating layer 67 may entirely cover the interlayer insulating layer 37, the interconnections 41, the protection patterns 43, and the TSV 53. The upper insulating layer 67 may completely cover the protection patterns 43. The upper insulating layer 67 may directly contact the upper surfaces of the protection patterns 43 and the interconnections 41. Upper surfaces of the upper insulating layer 67 and the landing pads 65 and 66 may be exposed to be coplanar. The landing pads 65 and 66 may include a first landing pad 65 and a second landing pad 66. The first landing pad 65 may be connected to the TSV 53 via the upper interconnections 61, 62, and 63 formed in the upper insulating layer 67. The second landing pad 66 may be electrically connected to a selected one of the interconnections 41.

The upper insulating layer 67 may include, for example, silicon oxide, silicon nitride, silicon oxynitride, low-K dielectrics, or a combination thereof. The upper interconnections 61, 62, and 63 may include, for example, a metal, a metal nitride, a metal silicide, conductive carbon, or a combination thereof. The landing pads 65 and 66 may include, for example, a metal, a metal nitride, a metal silicide, conductive carbon, or a combination thereof.

Figure 33:
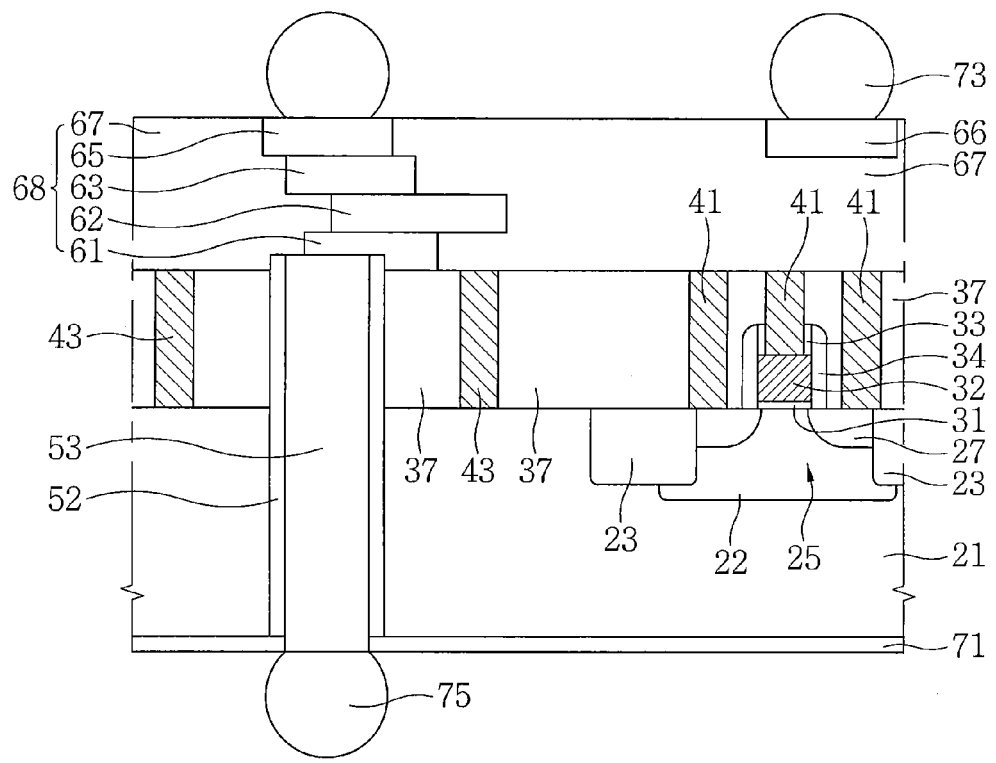

Referring to FIGS. 2 and 33, first terminals 73 may be formed on the landing pads 65 and 66. The TSV 53 may be exposed by partially removing a back side of the substrate 21. A back-side insulating layer 71 may be formed on the back side of the substrate 21. In some embodiments, the back-side insulating layer 71 may cover the back side of the substrate 21 and may expose the TSV 53. A second terminal 75 may be formed on the TSV 53.

For example, the back-side insulating layer 71 may include silicon oxide, silicon nitride, silicon oxynitride, low-K dielectrics, or a combination thereof. Each of the first terminals 73 may include a solder ball, a conductive bump, a conductive tap, a lead grip array (LGA), a pin grip array (PGA), or a combination thereof. The second terminal 75 may include a solder ball, a conductive bump, a conductive tap, a LGA, a PGA, or a combination thereof.

Figure 34:
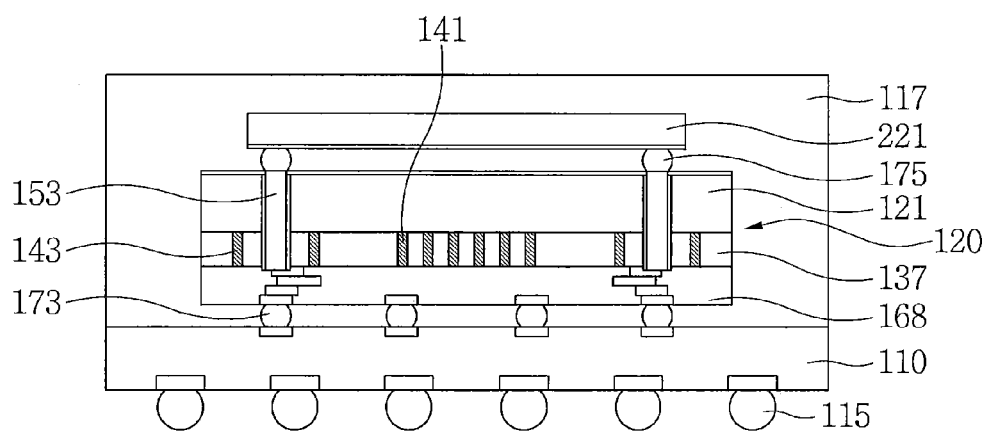
FIG. 34 is a cross-sectional view illustrating a method of forming a semiconductor device according to some embodiments of the present inventive concept.

FIG. 34 is a cross-sectional view illustrating a method of forming a semiconductor device according to some embodiments of the present inventive concept.

Referring to FIG. 34, a first semiconductor chip 120 may be mounted on a package substrate 110. The first semiconductor chip 120 may include a semiconductor substrate 121, an interlayer insulating layer 137, interconnections 141, protection patterns 143, TSVs 153, and an upper interconnection layer 168, first terminals 173, and second terminals 175. A second semiconductor chip 221 may be mounted on the first semiconductor chip 120. An encapsulant 117 may be formed on the first semiconductor chip 120 and the second semiconductor chip 221 and may be formed on the package substrate 110. In some embodiments, the encapsulant 117 may cover the first semiconductor chip 120 and the second semiconductor chip 221. External terminals 115 may be formed under the package substrate 110.

The first semiconductor chip 120 may have a configuration similar as the above-described configuration with reference to FIGS. 1 through 33. For example, the protection patterns 143 may be similar to the protection patterns 43 shown in FIG. 1. The package substrate 110 may include, for example, a rigid printed circuit board, a flexible printed circuit board, or a rigid-flexible printed circuit board. Each of the external terminals 115 may include a solder ball, a conductive bump, a conductive tap, a LGA, a PGA, or a combination thereof. The encapsulant 117 may include, for example, a molding compound, a ceramic plate, an underfill, a curable polymer, or a combination thereof.

Figure 35:
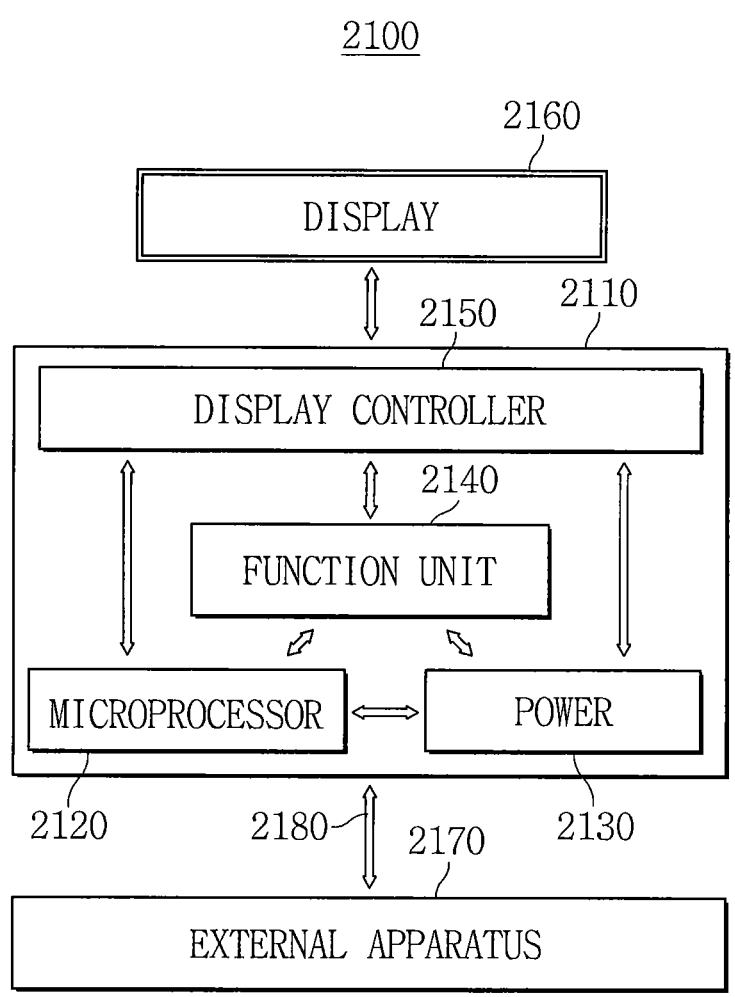
FIG. 35 is a system block diagram of electronic devices according to some embodiments of the present inventive concept.

FIG. 35 is a system block diagram of electronic devices according to some embodiments of the present inventive concept.

Referring to FIG. 35, a semiconductor device according to some embodiments of the present inventive concept may be applied to an electronic system 2100. The electronic system 2100 may include a body 2110, a microprocessor 2120, a power unit 2130, a function unit 2140, and a display controller 2150. The body 2110 may be a motherboard formed of a printed circuit board (PCB). The microprocessor 2120, the power unit 2130, the function unit 2140, and the display controller 2150 may be mounted on the body 2110. A display unit 2160 may be disposed inside or outside the body 2110. For example, the display unit 2160 may be disposed on a surface of the body 2110, and may display an image processed by the display controller 2150.

The power unit 2130 may receive a constant voltage from an external battery (not shown), divide the voltage into required voltage levels, and supply the voltages to the microprocessor 2120, the function unit 2140, the display controller 2150, etc. The microprocessor 2120 may receive the voltage from the power unit 2130, and control the function unit 2140 and the display unit 2160. The function unit 2140 may perform various functions of the electronic system 2100. For example, when the electronic system 2100 is a smart phone, the function unit 2140 may include various components to perform phone functions such as dialing, image output to the display unit 2160 or voice output to a speaker through communication with an external apparatus 2170, etc., and when a camera is mounted, it may serve as a camera image processor.

In an application embodiment, when the electronic system 2100 is connected to a memory card to expand the capacity, the function unit 2140 may be a memory card controller. The function unit 2140 may exchange signals with the external apparatus 2170 through a wired or wireless communication unit 2180. When the electronic system 2100 requires a Universal Serial Bus (USB) to extend the functions, the function unit 2140 may serve as an interface controller. The function unit 2140 may include a mass storage device.

A semiconductor device according to some embodiments of the present inventive concept may be applied to the function unit 2140 or the microprocessor 2120.

In accordance with embodiments of the present inventive concept, interconnections, a protection pattern, and a TSV may be provided. The protection pattern may be formed in a keep out zone (KOZ) K. The protection pattern may serve to reduce or possibly prevent galvanic corrosion of the interconnections. The protection pattern may serve to reduce or possibly prevent by-product adhesion caused by the galvanic corrosion. The protection pattern may serve to reduce or possibly prevent galvanic corrosion of the TSV and the interconnections. The semiconductor device according to some embodiments of the present inventive concept may have excellent electrical characteristics.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device, comprising:
    a substrate comprising a keep out zone (KOZ);
    a plurality of interconnections disposed outside of the KOZ on the substrate;
    a through silicon via (TSV) in the KOZ, the TSV passing through the substrate; and
    a protection pattern in the KOZ, the protection pattern being electrically insulated from the TSV and comprising a conductive material different from the TSV,
    wherein a lower end of the protection pattern is at a level higher than a lower end of the TSV.

2. The semiconductor device according to claim 1, wherein the plurality of interconnections comprise the conductive material.

3. The semiconductor device according to claim 1, wherein the protection pattern and the plurality of interconnections comprise tungsten (W), and the TSV comprises copper (Cu).

4. The semiconductor device according to claim 1, wherein the protection pattern comprises a more active conductive material than the plurality of interconnections and the TSV in a galvanic table.

5. The semiconductor device according to claim 1, wherein the protection pattern surrounds the TSV.

6. The semiconductor device according to claim 1, wherein the protection pattern is disposed between the TSV and the plurality of interconnections.

7. The semiconductor device according to claim 1, wherein an upper end of the protection pattern and upper ends of the plurality of interconnections are at a substantially equal horizontal level.

8. The semiconductor device according to claim 7, wherein the lower end of the protection pattern and a lower end of at least one of the plurality of the interconnections are at a substantially equal horizontal level.

9. The semiconductor device according to claim 1, wherein the protection pattern contacts the substrate.

10. The semiconductor device according to claim 1, wherein an upper end of the TSV protrudes from upper ends of the protection pattern and the plurality of interconnections, and a vertical distance between the upper end of the TSV and the upper ends of the plurality of interconnections is about 20 nm or less.

11. The semiconductor device according to claim 1, wherein upper ends of the TSV, the protection pattern, and the plurality of interconnections are at a substantially equal horizontal level.

12. The semiconductor device according to claim 1, wherein a first distance is a distance between the protection pattern and the TSV, and a second distance is a distance between one of the plurality of interconnections that is closest to the protection pattern and the protection pattern, and wherein the first distance is smaller than the second distance.

13. The semiconductor device according to claim 12, wherein a third distance is a distance between two of the plurality of interconnections, and wherein the first distance is greater than the third distance.

14. The semiconductor device according to claim 1, wherein a horizontal width of the protection pattern is greater than a horizontal width of each of the plurality of interconnections.

15. The semiconductor device according to claim 1, further comprising:

an upper interconnection layer disposed on the TSV, the protection pattern and the plurality of interconnections, wherein a lower surface of the upper interconnection layer directly contacts upper surfaces of the plurality of interconnections, the protection pattern and the TSV.

16. The semiconductor device according to claim 15, wherein the upper interconnection layer comprises:

an upper insulating layer; and an upper interconnection in the upper insulating layer and connected to an upper end of the TSV, wherein the upper insulating layer directly contacts the upper surfaces of the protection pattern and the plurality of interconnections, and the upper interconnection directly contacts the upper end of the TSV through the upper insulating layer.

17. A semiconductor device, comprising:

a plurality of first patterns on a substrate, the plurality of first patterns comprising a first conductive material;

a second pattern on the substrate, the second pattern comprising a second conductive material different from the first conductive material; and a protection pattern between the plurality of first patterns and the second pattern on the substrate, the protection pattern being closer to the second pattern than the plurality of first patterns and comprising a third conductive material different from the second conductive material, wherein a first end of each of the plurality of first patterns, a second end of the second pattern, and a third end of the protection pattern are exposed at a substantially equal horizontal level, and the protection pattern is electrically isolated from the second pattern.

18. The semiconductor device according to claim 17, wherein the third conductive material is substantially equal to the first conductive material.

19. The semiconductor device according to claim 17, wherein the third conductive material is different from the first conductive material and the second conductive material, and the third conductive material comprises a material more active than the first conductive material and the second conductive material in a galvanic table.

20. A semiconductor device, comprising:

a plurality of interconnections on a substrate, the plurality of interconnections comprising a first conductive material;

a through silicon via (TSV) on the substrate, the TSV comprising a second conductive material different from the first conductive material; and a protection pattern between the plurality of interconnections and the TSV on the substrate, the protection pattern comprising a third conductive material different from the first conductive material and the second conductive material, wherein the third conductive material comprises a material more active than the plurality of interconnections and the TSV in a galvanic table.

* * * * *